(12) United States Patent
Chakraborty et al.

(10) Patent No.: US 11,777,496 B1
(45) Date of Patent: Oct. 3, 2023

(54) LOW VOLTAGE SIGNAL PATH IN A RADIO FREQUENCY SIGNAL GENERATOR

(71) Applicant: International Business Machines Corporation, Armonk, NY (US)

(72) Inventors: Sudipto Chakraborty, Plano, TX (US); John Francis Bulzacchelli, Somers, NY (US); Daniel Joseph Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/892,324

(22) Filed: Aug. 22, 2022

(51) Int. Cl.
| | |
|---|---|
| *H03D 7/14* | (2006.01) |
| *H03K 17/687* | (2006.01) |
| *G06N 10/20* | (2022.01) |
| *H03K 5/02* | (2006.01) |
| *H03K 5/1252* | (2006.01) |

(52) U.S. Cl.
CPC ......... *H03K 17/6871* (2013.01); *G06N 10/20* (2022.01); *H03D 7/1425* (2013.01); *H03K 5/02* (2013.01); *H03K 5/1252* (2013.01)

(58) Field of Classification Search
CPC ........ H03F 3/005; H03F 3/45; H03F 3/45475; G11C 27/024; H03K 17/00; H03K 17/16; H03D 7/1441; H03D 7/1425; H03D 7/125; H03D 7/1483; H03D 7/166; H03D 2200/0043
See application file for complete search history.

(56) References Cited

U.S. PATENT DOCUMENTS

| | | | |
|---|---|---|---|
| 7,212,068 B2 | 5/2007 | Ónody | |
| 8,803,596 B2 | 8/2014 | Soe | |
| 8,901,995 B2 | 12/2014 | Shook | |
| 9,654,070 B2 | 5/2017 | MacDonald et al. | |
| 10,423,178 B1 | 9/2019 | Chen | |
| 10,560,070 B2 | 2/2020 | Gramegna | |
| 10,734,957 B2 | 8/2020 | Soe et al. | |
| 10,778,189 B1 | 9/2020 | Dey | |
| 2009/0067545 A1* | 3/2009 | Chu | H03F 3/45475 330/258 |
| 2013/0257514 A1 | 10/2013 | Rowley et al. | |
| 2022/0035391 A1 | 2/2022 | Bartoli | |

(Continued)

OTHER PUBLICATIONS

V. E. Chumakov et al., "Voltage Followers for The Design of Sallen-Key Active RC-Filters," doi:10.20944/preprints202112.0339. v1, Dec. 21, 2021, 14 pages.

(Continued)

*Primary Examiner* — Jung Kim
(74) *Attorney, Agent, or Firm* — Erik Johnson; Ryan, Mason & Lewis, LLP

(57) ABSTRACT

A device comprises a voltage-mode filter circuit, a current-mode output circuit, and a regulation circuit. The voltage-mode filter circuit is configured to generate a voltage signal on an output terminal thereof. The current-mode output circuit comprises an input transistor which comprises a gate terminal coupled to the output terminal of the voltage-mode filter circuit, and a source terminal coupled to a regulated node. The regulation circuit is configured to adjust a voltage level on the regulated node to maintain a constant gate-source bias voltage for the input transistor to generate a current for biasing the current-mode output circuit.

25 Claims, 16 Drawing Sheets

(56) References Cited

U.S. PATENT DOCUMENTS

| | | |
|---|---|---|
| 2022/0045646 A1 | 2/2022 | Dey et al. |
| 2022/0075402 A1 | 3/2022 | Wang et al. |
| 2022/0158626 A1 | 5/2022 | Chakraborty et al. |

OTHER PUBLICATIONS

O. B. Olalekan et al., "Sallen-Key Topology, MFB And Butterworthy In Bandpass Design For Audio Circuit Design," Asian Journal of Electrical Sciences, vol. 6, No. 1, Jan.-Jun. 2017, pp. 23-28.

I.-Y. Lee et al., "A 50-450 MHz Tunable RF Biquad Filter Based on a Wideband Source Follower With > 26 dBm IIP3, +12 dBm P1dB, and 15 dB Noise Figure," IEEE Journal of Solid-State Circuits, vol. 50, No. 10, Oct. 2015, pp. 2294-2305.

F. Centurelli et al., "10-GHz Fully Differential Sallen-Key Lowpass Biquad Filters in 55nm SiGe BiCMOS Technology," Electronics, vol. 9, Mar. 28, 2020, 14 pages.

K. Nikolic et al., "A Tunable Bandwidth 6th-Order Active Low-Pass Filter In 0.18 um CMOS Technology," 23rd International Symposium on Design and Diagnostics of Electronic Circuits, Apr. 22-24, 2020, 4 pages.

B. Patra et al., "A Scalable Cryo-CMOS 2-to-20GHz Digitally Intensive Controller for 4×32 Frequency Multiplexed Spin Qubits/ Transmons in 22nm FinFET Technology for Quantum Computers," IEEE International Solid-State Circuits Conference, Feb. 2020, 3 pages.

J. C. Bardin et al., "A 28nm Bulk-CMOS 4-to-8GHz <2mW Cryogenic Pulse Modulator for Scalable Quantum Computing," eprint arXiv:1902.10864, Feb. 2019, 12 pages.

\* cited by examiner 300-1

300-2

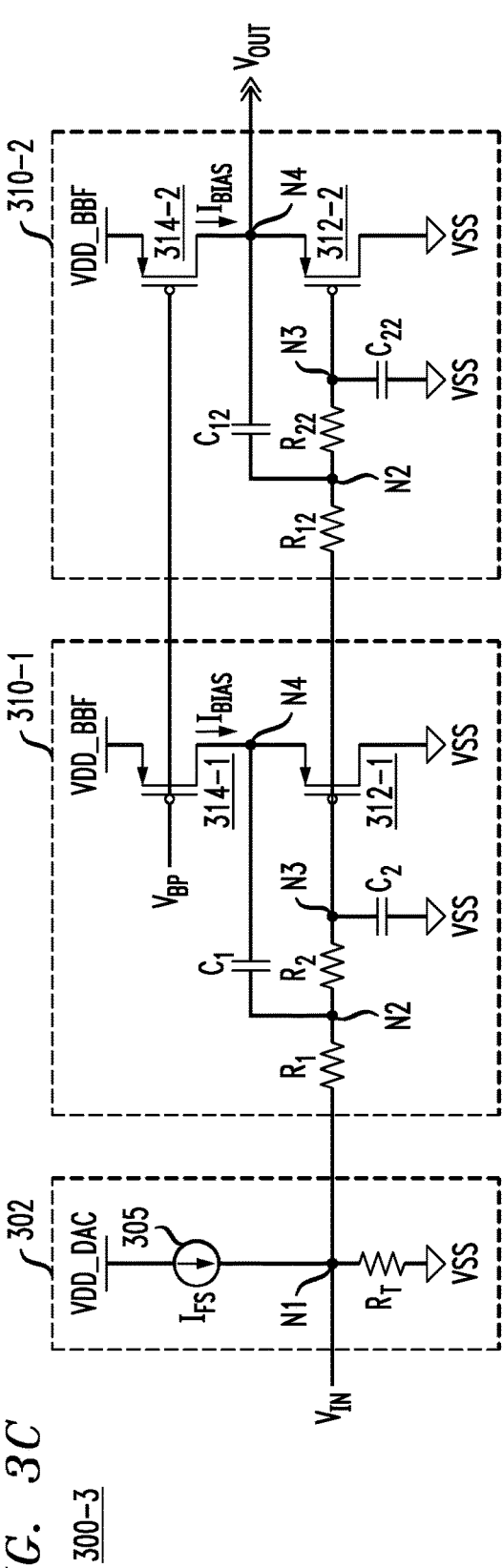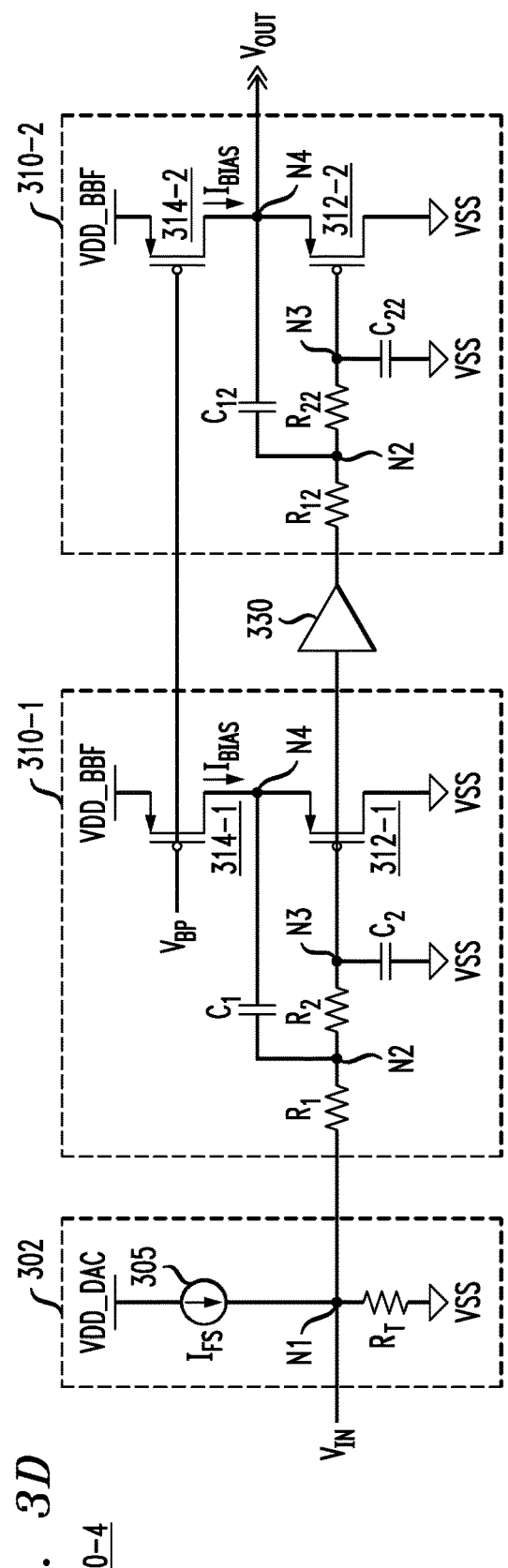
FIG. 3C
300-3
FIG. 3D
300-4

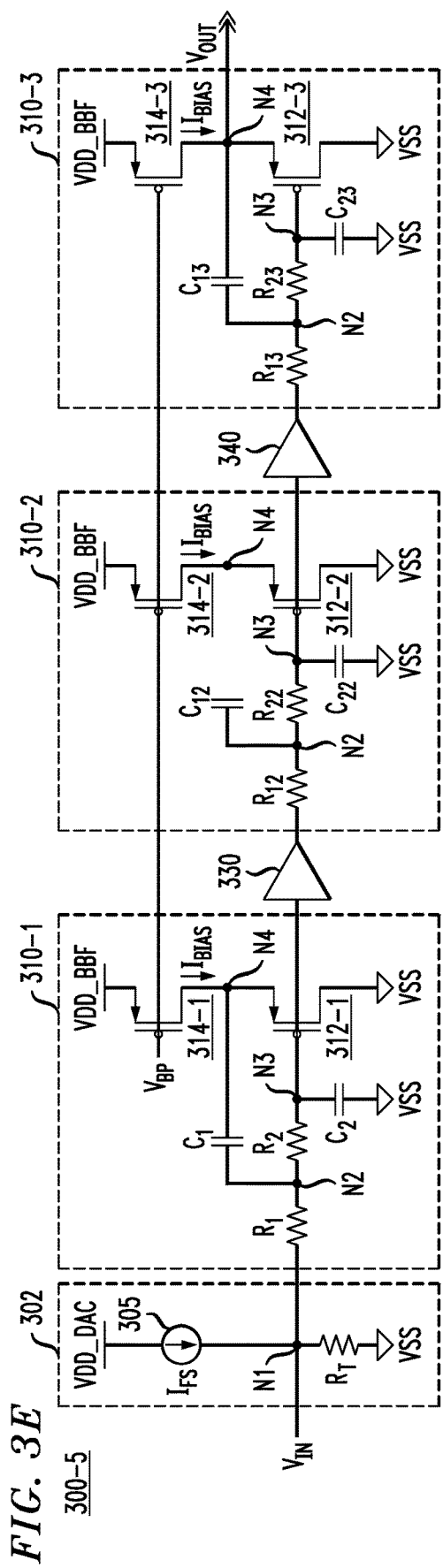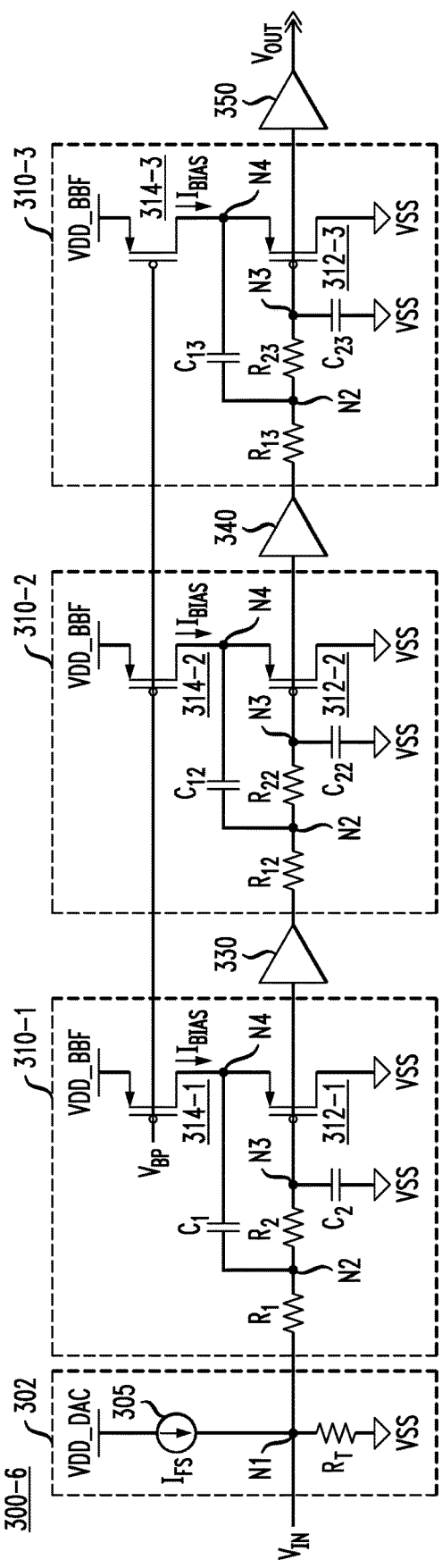
FIG. 3E
FIG. 3F

500

520

600

700

800

900

LOW VOLTAGE SIGNAL PATH IN A RADIO FREQUENCY SIGNAL GENERATOR

BACKGROUND

This disclosure relates generally to radio frequency (RF) signal generators and, in particular, to techniques for reducing supply voltage levels and power consumption of RF signal generators such as arbitrary waveform generator (AWG) systems. An RF signal generator may be implemented with a quadrature architecture, in which a baseband signal is upconverted to an RF signal using a single-sideband (SSB) modulation system that modulates quadrature local oscillator (LO) signals using quadrature baseband signals. Such RF signal generators are utilized for applications such as, e.g., wireless transmitters, and generating control pulses for quantum bits (qubits) in a quantum computing system, etc. In particular, in quantum computing applications, AWG systems that are capable of generating RF control pulses with variable amplitude and low distortion are desirable for controlling qubits of a quantum processor. In addition, minimizing power consumption of an AWG system is of critical importance, especially in the context of cryogenic RF signal generation for qubit control.

An RF signal generator can have various signal processing stages implemented using current-mode circuitry, which provides a favorable tradeoff between power and performance. For instance, current-mode circuitry allows current reuse in which the current of one stage is shared with another stage to improve power efficiency. On the other hand, current-mode circuitry sometimes comprises stacked transistor architectures which may require relatively high supply voltages (and therefore higher power) to provide the necessary headroom to operate transistors in saturation mode.

SUMMARY

Exemplary embodiments of the disclosure include techniques for reducing supply voltage levels and power consumption of radio frequency signal generator systems, such as arbitrary waveform generator systems. Further, exemplary embodiments of the disclosure include techniques for interfacing voltage-mode circuitry with current-mode circuitry in radio frequency generator systems.

In an exemplary embodiment, a device comprises a voltage-mode filter circuit, a current-mode output circuit, and a regulation circuit. The voltage-mode filter circuit is configured to generate a voltage signal on an output terminal thereof. The current-mode output circuit comprises an input transistor which comprises a gate terminal coupled to the output terminal of the voltage-mode filter circuit, and a source terminal coupled to a regulated node. The regulation circuit is configured to adjust a voltage level on the regulated node to maintain a constant gate-source bias voltage for the input transistor to generate a current for biasing the current-mode output circuit.

Advantageously, the regulation circuit provides a mechanism for interfacing a voltage-mode filter circuit with a current-mode output circuit, while ensuring that a bias voltage (e.g., gate-source voltage) of the input transistor of the current-mode circuit is maintained at a constant bias voltage by adjusting the voltage level on the regulated node, as needed, so that the input transistor generates a stable quiescent current at a desired level for biasing the current-mode output circuit. In the absence of the regulation circuit, the bias voltage of the input transistor could vary due to variations of a power supply voltage, which would cause variation in the quiescent current of the input transistor and, thus an unstable bias point of the current-mode output circuit.

In an exemplary embodiment, as may be combined with the preceding paragraphs, the voltage-mode filter circuit comprises an analog biquadratic low-pass filter circuit which implements a unity gain source follower circuit. Advantageously, as compared to current-mode filter circuits, the voltage-mode filter circuit comprises a filter architecture with fewer stacked transistors, which allows relatively lower supply voltages (e.g., 500 mV-700 mV) to be utilized for the voltage-mode baseband filter circuit, and thus, achieve lower power consumption and improved power efficiency.

Another exemplary embodiment includes a system which comprises a radio frequency signal generator that is configured to convert a baseband signal to a radio frequency signal. The radio frequency signal generator comprises a baseband filter stage, an output stage, and a regulation circuit. The baseband filter stage comprises a voltage-mode filter circuit which is configured to filter the baseband signal and generate a voltage signal on an output terminal of the voltage-mode filter circuit. The output stage is configured to generate and output the radio frequency signal. The output stage comprises a plurality of current-mode stages including a baseband input stage. The baseband input stage comprises an input transistor which comprises a gate terminal coupled to the output terminal of the voltage-mode filter circuit, and a source terminal coupled to a regulated node. The regulation circuit is configured to adjust a voltage level on the regulated node to maintain a constant gate-source bias voltage for the input transistor to generate a current for biasing the current-mode stages of the output stage.

In an exemplary embodiment, as may be combined with the preceding paragraphs, the current-mode stages of the output stage comprise a mixer stage and an attenuation stage. The mixer stage and the attenuation stage have commonly connected input nodes which are connected to output nodes of the baseband input stage. The output nodes of the attenuation stage are coupled to a negative power supply node. Advantageously, in this configuration, the mixer stage and the attenuation stage are effectively placed at a same level of a stack structure of the output stage (e.g., reduce a height of transistor stack structure), which provides additional headroom that allows the output stage to operate at a reduced power supply voltage.

Another exemplary embodiment includes a system which comprises a quantum processor, and an arbitrary waveform generator. The quantum processor comprises at least one superconducting quantum bit. The arbitrary waveform generator comprises at least one arbitrary waveform generator channel configured to convert a baseband signal to a radio frequency control pulse which controls the at least one superconducting quantum bit. The at least one arbitrary waveform generator channel comprises a baseband filter stage, an output stage, and a regulation circuit. The baseband filter stage comprises a voltage-mode filter circuit which is configured to filter the baseband signal and generate a voltage signal on an output terminal of the voltage-mode filter circuit. The output stage is configured to generate and output the radio frequency control pulse. The output stage comprises a plurality of current-mode stages including a baseband input stage. The baseband input stage comprises an input transistor which comprises a gate terminal coupled to the output terminal of the voltage-mode filter circuit, and a source terminal coupled to a regulated node. The regulation circuit is configured to adjust a voltage level on the regulated node to maintain a constant gate-source bias voltage for the input transistor to generate a current for biasing the current-mode stages of the output stage.

Another exemplary embodiment includes a system which comprises a radio frequency signal generator which is configured to convert a baseband signal to a radio frequency signal. The radio frequency signal generator comprises a baseband filter stage, a mixer stage, an output stage, and a regulation circuit. The baseband filter stage comprises a voltage-mode filter circuit which is configured to filter the baseband signal and generate a voltage signal on an output terminal of the voltage-mode filter circuit. The mixer stage comprises a voltage-mode mixer circuit which is configured to convert the filtered baseband signal to the radio frequency signal. The output stage comprises a plurality of current-mode stages including a radio frequency signal input stage. The radio frequency signal input stage comprises an input transistor which comprises a gate terminal coupled to the output terminal of the voltage-mode mixer circuit, and a source terminal coupled to a regulated node. The regulation circuit is configured to adjust a voltage level on the regulated node to maintain a constant gate-source bias voltage for the input transistor to generate a current for biasing the current-mode stages of the output stage.

Advantageously, in this configuration, the voltage-mode mixer is placed between the voltage-mode filter and the current-mode output stage, which eliminates one level of transistor stacking in the current-mode output stage (which would otherwise exist if the current-mode output stage comprises a current-mode mixer stage). This configuration provides additional headroom to operate the current-mode output stage at a reduced power supply voltage.

Another exemplary embodiment includes a method which comprises: generating a voltage signal on an output terminal of a voltage-mode filter circuit; applying the voltage signal to a gate terminal of an input transistor of a current-mode output circuit, wherein the input transistor comprises a source terminal coupled to a supply voltage node; and adjusting a voltage level on the supply voltage node to maintain a constant gate-source bias voltage for the input transistor to generate a current for biasing the current-mode output circuit.

Other embodiments will be described in the following detailed description of exemplary embodiments, which is to be read in conjunction with the accompanying figures.

BRIEF DESCRIPTION OF THE DRAWINGS

FIG. 3C schematically illustrates a voltage-mode baseband filter circuit, according to another exemplary embodiment of the disclosure.

FIG. 3D schematically illustrates a voltage-mode baseband filter circuit, according to another exemplary embodiment of the disclosure.

FIG. 3E schematically illustrates a voltage-mode baseband filter circuit, according to another exemplary embodiment of the disclosure.

FIG. 3F schematically illustrates a voltage-mode baseband filter circuit, according to another exemplary embodiment of the disclosure.

DETAILED DESCRIPTION

Exemplary embodiments of the disclosure will now be described in further detail with regard to systems and methods for reducing supply voltage levels and power consumption of RF signal generator systems, such as arbitrary waveform generator systems, as well as techniques for interfacing voltage-mode circuitry with current-mode circuitry in radio frequency generator systems. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1:
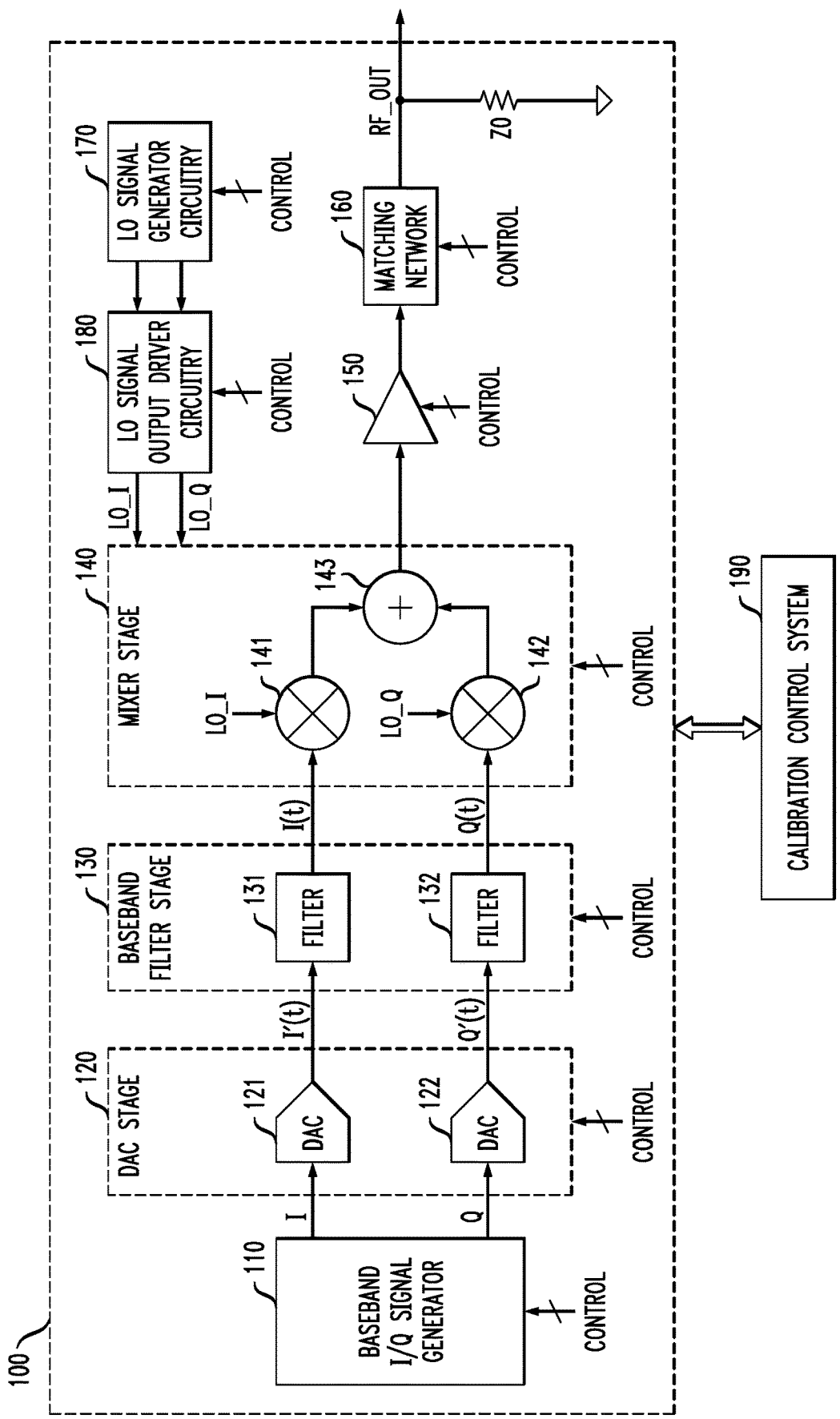
FIG. 1 schematically illustrates a radio frequency signal generator system, according to an exemplary embodiment of the disclosure.

FIG. 1 schematically illustrates a radio frequency signal generator system, according to an exemplary embodiment of the disclosure. In particular, FIG. 1 schematically illustrates an RF signal generator system 100 which comprises a baseband I/Q signal generator 110, a digital-to-analog converter stage 120 (or DAC stage 120), a baseband filter stage 130, a mixer stage 140, an amplifier stage 150, an impedance matching network 160, local oscillator (LO) signal generator circuitry 170, and LO signal output driver circuitry 180, the functions of which will be explained in further detail below. A calibration control system 190 is configured to calibrate various stages of the RF signal generator system 100 using digital control signals. The calibration control system 190 is implemented using a combination of software (e.g., program execution) and hardware (e.g., control logic and circuitry) to implement various control functions, as described herein.

As schematically illustrated in FIG. 1, the DAC stage 120 comprises inputs that are coupled to outputs of the baseband signal generator 110. The baseband filter stage 130 comprises inputs that are coupled to outputs of the DAC stage 120. The mixer stage 140 comprises inputs that are coupled to outputs of the baseband filter stage 130. The amplifier stage 150 comprises inputs that are coupled to outputs of the mixer stage 140, and an output that is coupled to an input of the impedance matching network 160, and an output of the impedance matching network 160 is coupled to an output node (RF OUT) of the RF signal generator system 100. The LO signal generator circuitry 170 is configured to generate LO signals (e.g., quadrature LO signals) that are utilized by the mixer stage 140 to perform upconversion of the baseband signals. The LO signal output driver circuitry 180 is configured to control the input of the LO signals to the mixer stage 140 for different modes of operation of the RF signal generator system 100 (e.g., real-time operating mode, and calibration mode), as will be discussed in further detail below.

It is to be understood that the RF signal generator system 100 can be implemented for various applications. For example, in some embodiments, the RF signal generator system 100 comprises an RF transmitter for a wireless application, wherein an output of the RF signal generator system 100 is coupled to an antenna system which is configured to transmit an RF output signal that is generated by the RF signal generator system 100. In other embodiments, the RF signal generator system 100 comprises a waveform generator (e.g., an AWG, or a function generator) in which the output of the RF signal generator system 100 is coupled to an input of a sensor device, wherein the RF output signal that is generated by the RF signal generator system 100 is configured to excite the sensor device. In other embodiments, for quantum computing applications, the RF signal generator system 100 comprises an AWG system which is configured to generate an RF control pulse for controlling the operation of, e.g., a superconducting qubit, an active superconducting coupler circuit which couples two superconducting qubits, or other superconducting quantum devices, etc.

In the context of the exemplary embodiments discussed herein, an RF signal comprises a signal which has a frequency ranging from, e.g., about 20 kHz to about 300 GHz. In some embodiments, the RF signal generator system 100 comprises an analog quadrature system that is configured to generate quadrature (I/Q) signals (e.g., baseband I/Q signals and LO I/Q signals) and perform quadrature modulation (or I/Q signal modulation) to generate RF signals for a given application. As is known in the art, a quadrature signal comprises an in-phase (I) signal component, and a quadrature-phase (Q) signal component. A pair of signals that are in quadrature have the same frequency, but differ in phase by 90 degrees. For example, by convention, the I signal is a cosine waveform, and the Q signal is a sine waveform. For illustrative purposes, exemplary embodiments of the disclosure will be described in the context of quadrature RF signal generator systems, although the exemplary signal processing circuitry and methods as discussed herein can be implemented with other types of RF signal generator systems and modulation techniques.

In the exemplary embodiment of FIG. 1, the baseband signal generator 110 is configured to generate digital quadrature signals I and Q which represent input baseband data for a given application. For example, for quantum computing applications, the baseband signal generator 110 is configured to implement pulse-shaping techniques to generate RF control pulses with desired envelope shapes (e.g., Gaussian pulses, cosine pulses (e.g., sum of half cosines), hyperbolic secant pulses, etc.), which are applied to superconducting qubits or active qubit coupler circuits to perform single qubit gate operations, entanglement gate operations, etc. In some embodiments, the baseband signal generator 110 implements digital signal processing techniques based on a combination of hardware and software to generate the digital quadrature baseband signals I and Q.

The DAC stage 120 is configured to convert the digital quadrature signals I and Q to analog baseband signals I'(t) and Q'(t) having a target baseband frequency. In particular, the DAC stage 120 comprises multi-bit DAC circuits including a first DAC circuit 121 and a second DAC circuit 122. The first DAC circuit 121 is configured to convert the digital baseband component I to an analog baseband component I'(t) having a baseband frequency, and the second DAC circuit 122 is configured to convert the digital baseband component Q to an analog baseband component Q'(t) having the same baseband frequency, but phase-shifted by 90 degrees relative to I'(t). The DAC stage 120 generates and outputs the analog baseband signals I'(t) and Q'(t) at a given sampling rate (fs) or sampling frequency, e.g., baseband frequencies in a range of about 100 kHz to about 1 GHz depending on the given application. In some embodiments, the first and second DAC circuits 121 and 122 implement a configurable hardware framework in which various operating parameters of the DAC stage 120 can be adjusted by digital control signals that are input to the DAC stage 120. For example, in some embodiments, the digital control can be utilized to adjust DAC operating parameters including, but not limited to, the sampling rate, analog output gain, etc.

Based on the Nyquist Sampling Theorem, the highest fundamental output frequency $f_O$ signal a DAC with sampling frequency fs can generate is equal to half the sampling rate or $f_S/2$ (referred to as the first Nyquist zone). In the frequency domain, when generating a sinusoidal waveform of frequency $f_O$, the fundamental baseband frequency $f_O$ will appear as a spectral component at $f_O$, and there will be additional higher frequency components that are generated at the output of the DAC stage 120, which are referred to as "images" and which are a function of $f_S$ and $f_O$. For example, the higher frequency components are determined as $|(n \times f_S) \pm f_O|$, where n=1, 2, 3, . . . . The images have the same information content as the fundamental spectral components, but at higher frequencies and at smaller amplitudes. The unwanted images are suppressed/rejected using, e.g., the baseband filter stage 130.

The baseband filter stage 130 is configured to filter the analog baseband signals I' (t) and Q'(t) output from the DAC stage 120 to thereby generate filtered analog baseband signals I(t) and Q(t). The baseband filter stage 130 comprises a first filter circuit 131 and a second filter circuit 132. The first filter circuit 131 is configured to filter the in-phase analog signal I' (t) output from the first DAC circuit 121, and the second filter circuit 132 is configured to filter the quadrature-phase analog signal Q'(t) output from the second DAC circuit 122. In some embodiments, the first and second filter circuits 131 and 132 comprise low-pass filters that are configured to pass the fundamental spectral components of the respective analog signals I' (t) and Q'(t), while suppressing the image components of the respective analog signals I' (t) and Q'(t). In other embodiments, the first and second filter circuits 131 and 132 can be configured as bandpass filters to pass a desired band of higher frequency image components of the respective analog signals I'(t) and Q'(t), while suppressing the fundamental spectral components and other image components of the respective analog signals I' (t) and Q'(t). In other embodiments, the first and second filter circuits 131 and 132 can be configured as high-pass filters, as may be desired for a given application.

In some embodiments, the baseband filter stage 130 comprises configurable filter circuits in which, e.g., the cutoff frequencies of the first and second filter circuits 131 and 132 can be adjusted, or where the first and second filter circuits 131 and 132 can be configured to have different filter types (e.g., low-pass, band-pass, etc.) as desired for a given application. For example, in some embodiments, a bandpass filter can be configured using two low pass filters using known signal filtering techniques and architectures. In some embodiments, the filter configurations are digitally controlled by the digital control signals that are input to the baseband filter stage 130.

For example, a higher DAC sampling frequency can be utilized as needed to transmit baseband data and/or relax the filter response of the downstream filters of the baseband filter stage 130. Indeed, an increase in the DAC sampling frequency results in the possibility of accommodating higher baseband transmission frequency (i.e., the analog signals I'(t) and Q'(t) have a higher baseband frequency). In addition, an increase in the DAC sampling frequency results in an increase in the separation between the center frequency to of the baseband component and the center frequencies $n \times f_S \pm f_O$ of the higher frequency images, which relaxes the required sharpness of the filter cutoffs at corner frequencies of the filters. However, the higher DAC sampling rate results in increased power consumption. So, a tradeoff in power consumption with DAC sampling frequency, and the sharpness of the filter cutoffs at the corner frequencies of the filters are factors that should be considered.

In some embodiments, the mixer stage 140 is configured to perform analog I/Q signal modulation, e.g., single-sideband (SSB) modulation, by mixing the filtered analog signals I(t) and Q(t), which are output from the baseband filter stage 130, with quadrature LO signals (e.g., an in-phase LO signal (LO_I) and a quadrature-phase LO signal (LO_Q)) to generate and output an analog RF signal (e.g., a single-sideband modulated RF output signal). The local oscillator signals LO_I and LO_Q each have the same LO frequency, but the LO_Q signal is phase-shifted by 90 degrees relative to the LO_I signal. For amplitude modulation, the filtered analog signals I(t) and Q(t) amplitude modulate the LO_I and LO_Q signals.

More specifically, the mixer stage 140 comprises a first mixer circuit 141 (e.g., I mixer circuit), a second mixer circuit 142 (e.g., Q mixer circuit), and a signal combiner circuit 143. The first mixer circuit 141 is configured to mix the filtered analog signal I(t) with the LO_I signal and generate a first RF signal output. The second mixer circuit 142 is configured to mix the filtered analog signal Q(t) with the LO_Q signal and generate a second RF signal output. The first and second RF signals output from the first and second mixer circuits 141 and 142 are input to the signal combiner circuit 143 and combined (e.g., added) to generate a single-sideband RF signal output.

In some embodiments, a quadrature phase shifter circuit is implemented to generate the quadrature LO signals LO_I and LO_Q signals. For example, a quadrature phase shifter circuit is configured to receive an LO signal as input, and output the quadrature LO signals LO_I and LO_Q based on the LO input signal. In this configuration, the LO_I signal comprises the same frequency and phase as the input LO signal, and the LO_Q signal comprises the same frequency as the input LO signal, but with a phase shift of 90 degrees. The quadrature phase shifter circuit can be implemented using one of various quadrature phase shifting techniques known to those of ordinary skill in the art.

The mixer stage 140 performs an upconversion mixing process which is configured to generate an RF analog signal which has a center frequency that is greater than the baseband frequency of the baseband signals output from the DAC stage 120. In some embodiments, the LO frequency of the mixer stage 140 is in a range of 100 MHz to about 10 GHz, depending on the application. More specifically, as is understood by those of ordinary skill in the art, as a result of the mixing operations of the first and second mixer circuits 141 and 142, the first and second RF signals that are output from the respective first and second mixer circuits 141 and 142 each comprise a double-sideband RF signal. A double-sideband signal comprises an upper sideband (USB) and a lower sideband (LSB) which are disposed at equal distances above and below the LO frequency. The upper sideband comprises a spectral band of frequencies that is higher than the LO frequency, and the lower sideband comprises a spectral band of frequencies that is lower than the LO frequency. The upper and lower sidebands each carry the same information content of the I/Q signals. For example, assume that the filtered analog signals I(t) and Q(t) (i.e., the modulating signals) have a center frequency $f_M$ (intermediate frequency) and that the LO signal has a frequency $f_{LO}$. The first and second RF signals that are output from the first and second mixer circuits 141 and 142 will each have (i) an upper sideband of spectral components, which is frequency-band centered at a frequency of $(f_{LO}+f_M)$ and (ii) a lower sideband of spectral components, which is frequency-band centered at a frequency of $(f_{LO}-f_M)$.

In some embodiments, the signal combiner circuit 143 is configured to add the first and second RF signals which are output from the first and second mixer circuits 141 and 142, in which case the signal combiner circuit 143 will output the "real" lower sideband signal as a single-sideband modulated RF signal (with a suppressed carrier frequency) having a center frequency which is upconverted from the frequency $f_M$ of the modulating signals I(t) and Q(t) to a center frequency $(f_{LO}-f_M)$ of the lower sideband. In other embodiments, the signal combiner circuit 143 is configured to subtract the first and second RF signals which are output from the first and second mixer circuits 141 and 142, in which case the signal combiner circuit 143 will output the "real" upper sideband signal as a single-sideband modulated RF signal (with a suppressed carrier) having a center frequency which is upconverted from the frequency $f_M$ the modulating signals I(t) and Q(t) to a center frequency $(f_{LO}+f_M)$ of the upper sideband. In other embodiments, the mixer stage 140 is configured as a double-sideband modulator (with a suppressed carrier frequency). More specifically, the mixer stage 140 can be configured to provide double-sideband modulation by maintaining the LO_Q input to the second mixer 142 at a constant zero voltage level (i.e., LO_Q=0). In this instance, the second mixer circuit 142 will have a zero output (i.e., no RF signal is output from the second mixer circuit 142), and the output of the signal combiner circuit 143 will be the double-sideband RF signal output from the first mixer circuit 141.

The amplifier stage 150 is configured to receive the modulated RF signal, which is output from the mixer stage 140, and amplify or attenuate the modulated RF signal to a desired power level, and drive the output of the RF signal generator system 100 (e.g., drive an antenna, sensor device, qubit, etc., which is coupled to the output of the RF signal generator system 100). In some embodiments, the amplifier stage 150 comprises a programmable gain, wherein gain can be expressed as a difference between the input power level (at the input to the amplifier stage 150) and the output power level (at the output of the amplifier stage 150) or, more specifically, as a ratio of output to input power. In some embodiments, the amplifier stage 150 is utilized to increase the power level of the RF output signal to a level which is sufficient to transmit (wirelessly, or wired) the modulated RF signal at given power level and over a required transmission distance. In other embodiments, the amplifier stage 150 comprises a programmable gain attenuation stage. The programmable gain attenuation stage comprises a programmable amplifier which is configured to amplify a modulated RF signal with a gain factor of 1, or less than 1. In this manner, the programmable gain attenuation stage can attenuate the power level of modulated RF signals that are output from the mixer stage 140, as desired, for a given application.

The impedance matching network 160 is configured to match a source impedance or load impedance of the output of the amplifier stage 150 to a characteristic impedance of an output load (e.g., antenna input, diplexer, etc.) of the RF signal generator system 100. In some embodiments, the impedance matching network 160 comprises a balun to convert a differential/balanced output of the amplifier stage 150 to a single-ended/unbalanced output. In some embodiments, the resonance parameters (e.g., impedance and bandwidth) of the impedance matching network 160 remain substantially invariant, wherein the impedance matching network 160 is designed with a center frequency which corresponds to a desired operating frequency of the load. In other embodiments, the impedance matching network 160 is configured with a plurality of injection points to provide different impedance matching and filtering characteristics. The different injection points can be selected by digital control signals applied to the impedance matching network 160. The impedance matching network 160 can have high pass and low pass characteristics, wherein the different injection points can be selected to provide different impedance matching and response characteristics. In some embodiments, the impedance matching network 160 is designed with a high-Q factor, wherein the center frequency of the impedance matching network 160 can be adjusted to provide sufficient impedance matching for different transmission frequencies which are generated by, e.g., changing the sampling frequency of the DAC stage 120 and/or changing the LO frequency of the mixer stage 140, depending on the given application.

In some embodiments, the LO signal generator circuitry 170 is configured to generate quadrature LO signals LO_I and LO_Q with a target center frequency, which are utilized by the mixer stage 140 to perform I/Q modulation and upconversion. In some embodiments, for a differential signal framework, the LO signal generator circuitry 170 is configured to generate complementary quadrature LO signals, which include complementary in-phase LO signals LO_I and $\overline{LO\_I}$, and complementary quadrature-phase LO signals LO_Q and $\overline{LO\_Q}$. Ideally, the complementary quadrature LO signals LO LO_I, LO_Q, $\overline{LO\_I}$, and $\overline{LO\_Q}$ have the same amplitude and center frequency, but different phases of 0°, 90°, 180°, and 270°, respectively.

The LO signal generator circuitry 170 can be implemented using known circuit architectures and LO signal generation techniques. For example, in some embodiments, the LO signal generator circuitry 170 comprises a phase-locked loop (PLL) system which is configured to generate an LO signal with a target center frequency, and phase-shifter circuitry which converts the LO signal generated by the PLL system, into quadrature LO signals LO_I and LO_Q. For differential quadrature LO signals, in some embodiments, the LO signal generator circuitry 170 can implement a quadrature phase-shifter circuit which is configured to receive as input a complementary pair of LO signals, LO and $\overline{LO}$, and generate the complementary quadrature LO signals LO_I, LO_Q, $\overline{LO\_I}$, and $\overline{LO\_Q}$. In some embodiments, the quadrature phase-shifter circuit can be implemented using a quadrature polyphase phase-shifter circuit having a single polyphase filter stage, or multiple polyphase filter stages, as is known to those of ordinary skill in the art.

The LO signal output driver circuitry 180 comprises LO signal driver stages which are configured to drive the LO inputs of the first and second mixer circuits 141 and 142 in the mixer stage 140 with the quadrature LO signals that are generated and output from the LO signal generator circuitry 170. In some embodiments, the LO signal output driver circuitry 180 is configured to selectively activate and deactivate segments of switching transistors of the first and second mixer circuits 141 and 142 to adjust the gain/attenuation of the RF output signal. An exemplary embodiment of the LO signal output driver circuitry 180 will be discussed in further detail below in conjunction with FIG. 7.

As shown in FIG. 1, the various signal processing stages 110, 120, 130, 140, 150, 160, 170, and 180 of the RF signal generator system 100 comprise control signal input ports that receive digital control signals from either the calibration system 190 or some processor or microcontroller which is configured to control operation of the RF signal generator system 100. The calibration system 190 can generate digital control signals to configure the RF signal generator system 100, or signal processing stages thereof, to operate in different modes. Further, in some embodiments, some or all of the stages 110, 120, 130, 140, 150, 160, 170, and 180 have a configurable hardware framework in which various operating parameters of the stages can be adjusted by the digital control signals for different operating modes of the RF signal generator system 100.

Figure 2A:
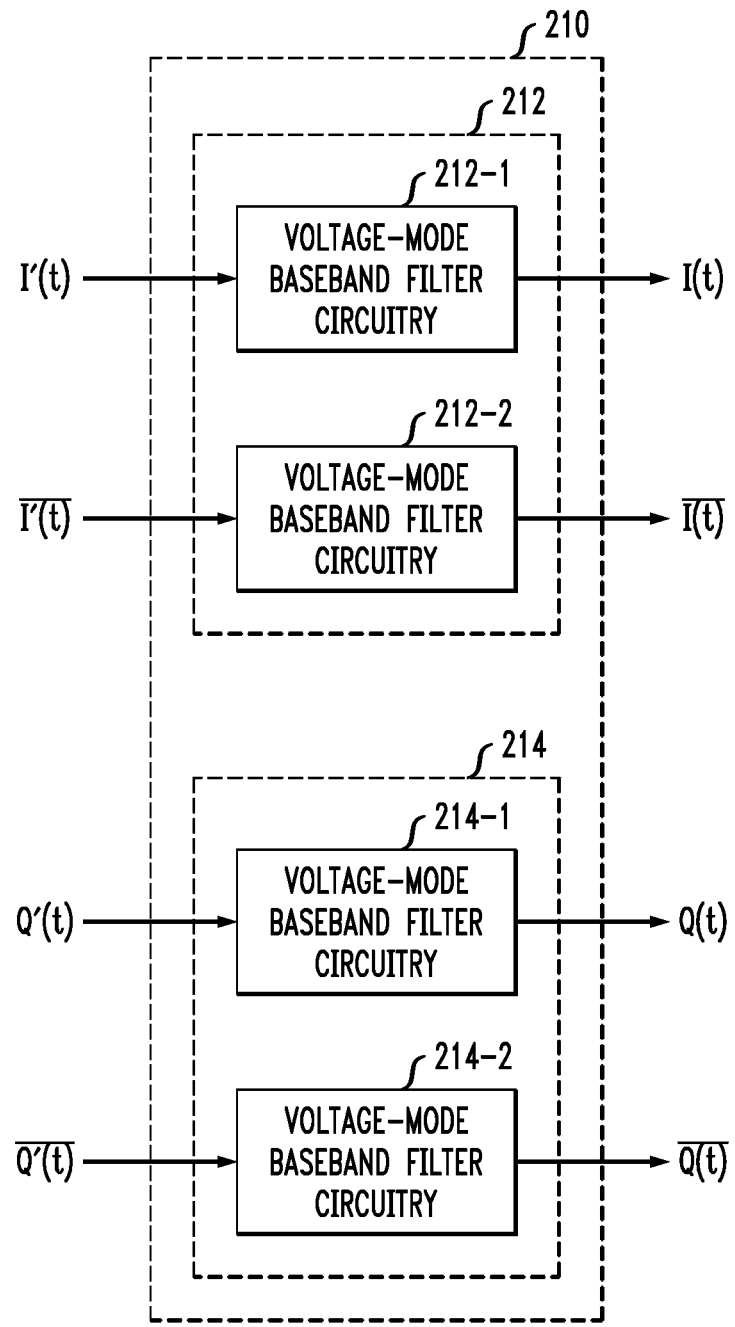
FIGS. 2A and 2B schematically illustrate a radio frequency signal generator system, according to another exemplary embodiment of the disclosure.
Figure 2B:
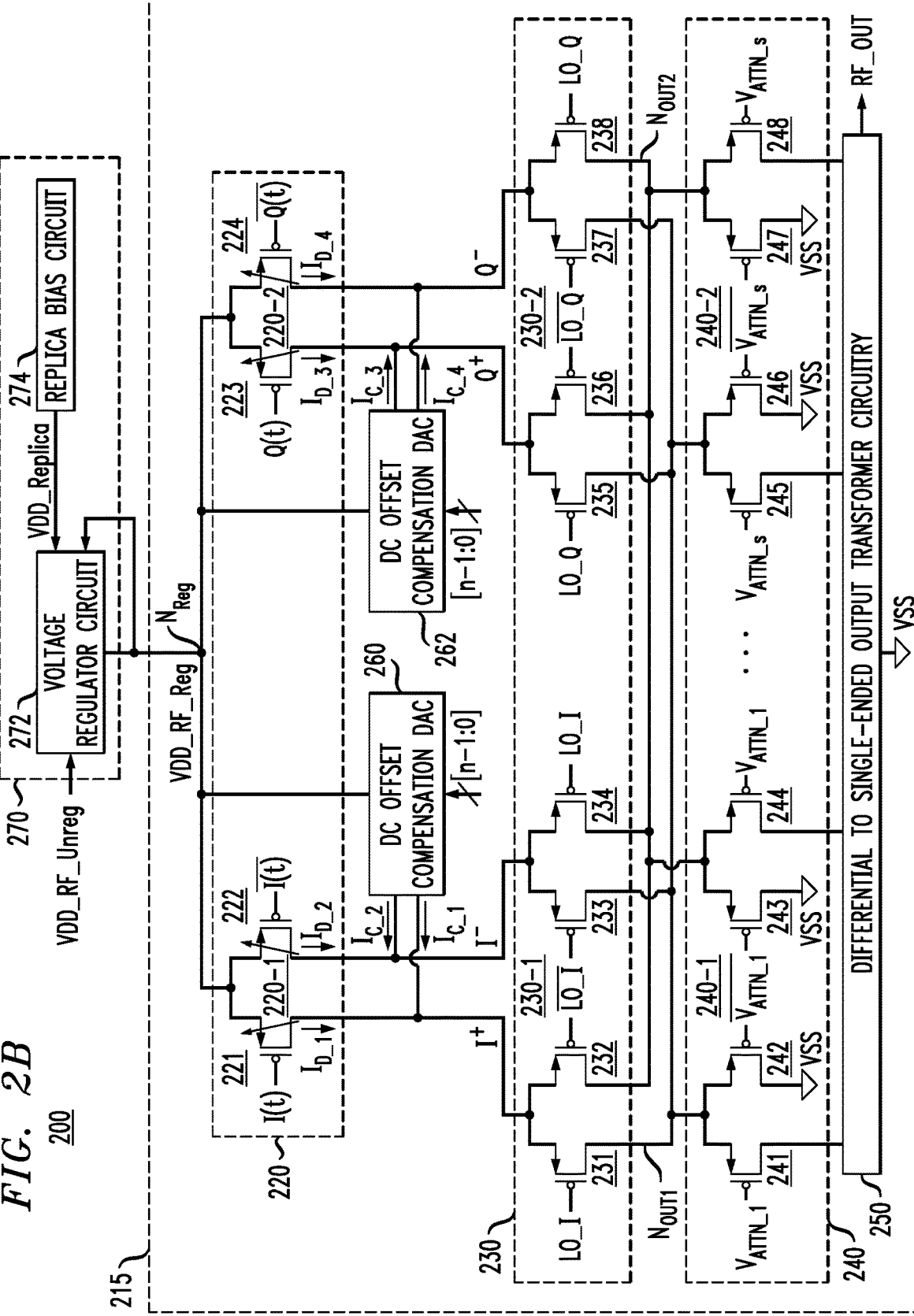

FIGS. 2A and 2B schematically illustrate a radio frequency signal generator system, according to another exemplary embodiment of the disclosure. More specifically, FIGS. 2A and 2B schematically illustrate an RF signal generator system 200, wherein FIG. 2A schematically illustrates a voltage-mode baseband filter stage 210 of the RF frequency signal generator system 200, and FIG. 2B schematically illustrates a current-mode RF output stage 215 of the RF signal generator system 200, wherein the current-mode RF output stage 215 comprises a baseband signal input stage 220, a current-commutating mixer stage 230, a signal attenuation stage 240, an output transformer stage 250, a first DC offset compensation DAC 260, and a second DC offset compensation DAC 262. The RF signal generator system 200 further comprises a regulation system 270 which comprises a voltage regulator circuit 272, and a replica bias circuit 274, the functions of which will be explained in further detail below. In some embodiments, the RF signal generator system 200 comprises a complementary quadrature architecture which is configured to operate with complementary in-phase baseband signals I(t) and $\overline{I(t)}$, complementary quadrature-phase baseband signals Q(t) and $\overline{Q(t)}$, and complementary quadrature LO signals comprising complementary in-phase LO signals LO_I and $\overline{LO\_I}$, and complementary quadrature-phase LO signals LO_Q and $\overline{LO\_Q}$.

In some embodiments, the voltage-mode baseband filter stage 210 of FIG. 2A schematically illustrates an exemplary embodiment of the baseband filter stage 130 of FIG. 1. Further, in some embodiments, the baseband signal input stage 220 and the current-commutating mixer stage 230 schematically illustrate an exemplary embodiment of the mixer stage 140 of FIG. 1. Further, in some embodiments, the signal attenuation stage 240 schematically illustrates an exemplary embodiment of the amplifier stage 150 of FIG. 1. Moreover, in some embodiments, the output transformer stage 250 represents an exemplary embodiment of the impedance matching network 160 of FIG. 1, wherein the output transformer stage 250 comprises circuitry for transforming a differential output signal to a single-ended output signal. The output transformer stage 250 can be implemented using various techniques and circuit configurations for transforming a differential output signal to a single-ended output signal, which are suitable for the given application and which are well known to those of ordinary skill in the art.

Referring to FIG. 2A, the voltage-mode baseband filter stage 210 comprises a first baseband filter 212, and a second baseband filter 214. The first baseband filter 212 comprises a first voltage-mode baseband filter circuit 212-1, and a second voltage-mode baseband filter circuit 212-2, which are configured to receive and filter respective complementary in-phase baseband signals I'(t) and $\overline{I'(t)}$, and output filtered complementary in-phase baseband signals I(t) and $\overline{I(t)}$. The second baseband filter 214 comprises a first voltage-mode baseband filter circuit 214-1, and a second voltage-mode baseband filter circuit 214-2, which are configured to receive and filter respective complementary quadrature-phase baseband signals Q'(t) and $\overline{Q'(t)}$, and output filtered complementary quadrature-phase baseband signals Q(t) and $\overline{Q(t)}$. In some embodiments, each of the voltage-mode baseband filter circuits 212-1, 212-2, 214-1, and 214-1 comprise single-ended voltage-mode filter circuits which are configured to convert respective unfiltered baseband signals I'(t), $\overline{I'(t)}$, Q'(t) and $\overline{Q'(t)}$, which comprise current-mode baseband signals that are generated by a current-mode baseband DAC stage (e.g., DAC stage 120, FIG. 1), into voltage signals which are filtered and output as filtered baseband voltage signals I(t), $\overline{I(t)}$, Q(t) and $\overline{Q(t)}$, respectively. Exemplary embodiments of the voltage-mode baseband filter circuitry will be discussed in further detail below in conjunction with the exemplary baseband filter circuit architectures shown in FIGS. 3A-3F.

Referring to FIG. 2B, the current-mode RF output stage 215 comprises a current-mode architecture in which the signal processing is performed with current signals flowing in the I/Q signal paths of the baseband signal input stage 220, the current-commutating mixer stage 230, and the signal attenuation stage 240. The baseband signal input stage 220 comprises a plurality of baseband input transistors 221, 222, 223, and 224. In some embodiments, the baseband input transistors 221, 222, 223, and 224 are p-type metal-oxide-semiconductor (PMOS) transistors. The transistors 221 and 222 comprise a first differential transistor pair 220-1, wherein the transistors 221 and 222 have source terminals that are commonly connected to an output terminal of the voltage regulator circuit 272, and respective gate terminals which receive the complementary baseband voltage signals I(t) and $\overline{I(t)}$, respectively, which are output from the respective first and second voltage-mode baseband filter circuits 212-1 and 212-2 of the baseband filter stage 210 (FIG. 2A). The transistors 223 and 224 comprise a second differential transistor pair 220-2, wherein the transistors 223 and 224 have source terminals that are commonly connected to the output terminal of the voltage regulator circuit 272, and respective gate terminals which receive the complementary baseband voltage signals Q(t) and $\overline{Q(t)}$, respectively, which are output from the respective first and second voltage-mode baseband filter circuits 214-1 and 214-2 of the voltage-mode baseband filter stage 210 (FIG. 2A). The transistors 221, 222, 223, and 224 each comprise a drain terminal that is connected to a respective one of a plurality of differential transistor pairs in the current-commutating mixer stage 230.

In some embodiments, the transistors 221, 222, 223, and 224 of the baseband signal input stage 220 comprise variable gain elements (as schematically illustrated by the slanted arrows across the transistors) which are configurable to adjust the baseband signal gain in the I/Q signal paths. For example, in some embodiments, each baseband input transistor 221, 222, 223, and 224 comprises a variable-width transistor that is structurally configured and controlled using known techniques to vary the effective gate width of the transistor structure and, thus, adjust a maximum amount of DC drain current $I_{D\_1}$, $I_{D\_2}$, $I_{D\_3}$, and $I_{D\_4}$ (e.g., quiescent current) that flows through the respective transistors 221, 222, 223, and 224 when operating in saturation mode.

For example, in some embodiments, each baseband input transistor 221, 222, 223, and 224 can be structurally configured to include a plurality of transistor segments that are coupled in parallel, wherein the number of segments that are active/inactive at a given time (via a digital switching control system) can be adjusted to change the effective gate width of a given baseband input transistor. In this regard, the effective widths of the transistors 221, 222, 223, and 224 in the baseband signal input stage 220 can be configured to adjust the baseband signal gain in the I/Q signal paths over a target gain range (e.g., gain range of 20 dB) with multiple gain step settings within the gain range. For example, in some embodiments, DC baseband currents can be adjusted to one of various target current levels over a given range wherein a highest baseband current level is about 10× greater than a lowest baseband current level (e.g., a range from about 35 uA to about 350 uA).

The current-commutating mixer stage 230 comprises a differential I mixer 230-1, and a differential Q mixer 230-2. The differential I mixer 230-1 comprises a plurality of mixing transistors 231, 232, 233, and 234 (alternatively, I mixer switching transistors 231, 232, 233, and 234). The differential Q mixer 230-2 comprises mixing transistors 235, 236, 237, and 238 (alternatively, Q mixer switching transistors 235, 236, 237, and 238). In some embodiments, as shown in FIG. 2, the mixing transistors 231, 232, 233, 234, 235, 236, 237, and 238 are PMOS transistors. In some embodiments, the mixing transistors 231, 232, 233, 234, 235, 236, 237, and 238 are biased to operate in triode mode.

In the differential I mixer 230-1, the mixing transistors 231 and 232 comprise a first differential mixer transistor pair having source terminals that are commonly connected to the drain terminal of the transistor 221 in the baseband signal input stage 220, and respective gate terminals which receive as input the complementary in-phase LO signals LO_I and $\overline{LO\_I}$, respectively. The mixing transistors 233 and 234 comprise a second differential mixer transistor pair having source terminals that are commonly connected to the drain terminal of the transistor 222 in the baseband signal input stage 220, and respective gate terminals which receive as input the complementary in-phase LO signals $\overline{LO\_I}$ and LO_I, respectively.

In the differential Q mixer 230-2, the mixing transistors 235 and 236 comprise a first differential mixer transistor pair having source terminals that are commonly connected to the drain terminal of the transistor 223 in the baseband signal input stage 220, and respective gate terminals which receive as input the complementary quadrature-phase LO signals LO_Q and $\overline{LO\_Q}$, respectively. The mixing transistors 237 and 238 comprise a second differential mixer transistor pair having source terminals that are commonly connected to the drain terminal of the transistor 224 in the baseband signal input stage 220, and respective gate terminals which receive as input the complementary quadrature-phase LO signals $\overline{LO\_Q}$ and LO_Q, respectively.

The current-commutating mixer stage 230 comprises two output nodes, denoted $N_{OUT1}$ and $N_{OUT2}$. As schematically shown in FIG. 2B, the mixing transistors 231, 233, 235, and 237 have drain terminals that are commonly coupled to the output node $N_{OUT1}$ of the current-commutating mixer stage 230, and the mixing transistors 232, 234, 236, and 238 have drain terminals that are commonly coupled to the output node $N_{OUT2}$ of the current-commutating mixer stage 230. The differential I mixer 230-1 and the differential Q mixer 230-2 are configured to provide analog I/Q modulation and upconversion, where the connections of the mixing transistors of the differential I and Q mixers 230-1 and 230-2 (operating in triode mode) allow for the summation/subtraction of the output currents of the mixing transistors 231, 232, 233, 234, 235, 236, 237, and 238 to achieve the SSB I/Q modulation, as is understood by those of ordinary skill in the art.

The signal attenuation stage 240 is configured to adjust a signal strength of the RF output signal. More specifically, in the exemplary embodiment of FIG. 2B, the signal attenuation stage 240 is configured to adjust the amount of differential current that flows from the output nodes $N_{OUT1}$ and $N_{OUT2}$ to the output transformer stage 250. In this regard, the signal attenuation stage 240 serves to adjust the signal level of the signal output from the current-commutating mixer stage 230. The signal attenuation stage 240 comprises a plurality of attenuation segments 240-1, . . . , 240-s which are digitally controlled by respective pairs of differential control signals $[V_{ATTN\_1}, \overline{V_{ATTN\_1}}] \ldots [V_{ATTN\_s}, \overline{V_{ATTN\_s}}]$. As schematically illustrated in FIG. 2B, the first attenuation segment 240-1 comprises a first differential pair of transistors 241 and 242, and a second differential pair of transistors 243 and 244. In addition, the attenuation segment 240-s comprises a first differential pair of transistors 245 and 246, and a second differential pair of transistors 247 and 248. In some embodiments, the transistors 241, 242, 243, 244, 245, 246, 247, and 248 of the signal attenuation stage 240 are PMOS transistors. The number (s) of attenuation segments 240-1, . . . , 240-s that are implemented will depend on the desired resolution of gain adjustment.

In the first attenuation segment 240-1, the first differential pair of transistors 241 and 242 have source terminals that are commonly connected to the mixer output node $N_{OUT1}$, and gate terminals that receive as input the differential control signals V ATTN_1 and $\overline{V_{ATTN\_1}}$, respectively. The transistor 241 has a drain terminal that is coupled to the output transformer stage 250, and the transistor 242 has a drain terminal that is coupled to a negative power supply node VSS (e.g., 0 V ground voltage). In addition, the second differential pair of transistors 243 and 244 have source terminals that are commonly connected to the mixer output node $N_{OUT2}$, and gate terminals that receive as input the differential control signals $\overline{V_{ATTN\_1}}$ and $V_{ATTN\_1}$, respectively. The transistor 243 has a drain terminal that is coupled to the negative power supply node VSS, and the transistor 244 has a drain terminal that is coupled to the output transformer stage 250.

Similarly, in the attenuation segment 240-s, the first differential pair of transistors 245 and 246 have source terminals that are commonly connected to the mixer output node $N_{OUT1}$, and gate terminals that receive as input the differential control signals $V_{ATTN\_s}$ and $\overline{V_{ATTN\_s}}$, respectively. The transistor 245 has a drain terminal that is coupled to the output transformer stage 250, and the transistor 246 has a drain terminal that is coupled to a negative power supply node VSS. In addition, the second differential pair of transistors 247 and 248 have source terminals that are commonly connected to the mixer output node $N_{OUT2}$, and gate terminals that receive as input the differential control signals $\overline{V_{ATTN\_s}}$ and $V_{ATTN\_s}$, respectively. The transistor 247 has a drain terminal that is coupled to the negative power supply node VSS, and the transistor 248 has a drain terminal that is coupled to the output transformer stage 250.

In operation, the amount of differential current that flows from the output nodes $N_{OUT1}$ and $N_{OUT2}$ to the output transformer stage 250 can be adjusted based on the number of attenuation segments 240-1, . . . , 240-s that are activated. A given attenuation segment is "activated" when the corresponding differential control signals $V_{ATTN}$ and $\overline{V_{ATTN}}$ are logic "0" and logic "1", respectively. For instance, the first attenuation segment 240-1 will be activated when $V_{ATTN\_1}$ is logic "0" and $\overline{V_{ATTN}}$ is logic "1" such that the transistors 241 and 244 will be in a turned "On" state and allow some current to flow from the output nodes $N_{OUT1}$ and $N_{OUT2}$ to the output transformer stage 250, while the transistors 242 and 243 will be in a turned "Off" state. On the other hand, the first attenuation segment 240-1 will be "deactivated" when $V_{ATTN\_1}$ is logic "1" and $\overline{V_{ATTN}}$ is logic "0" such that the transistors 241 and 244 will be in a turned "Off" state, and the transistors 242 and 243 will be in a turned "On" state and allow some current to flow from the output nodes $N_{OUT1}$ and $N_{OUT2}$ to the negative power supply node VSS (e.g., ground). Since this current flowing from the output nodes $N_{OUT1}$ and $N_{OUT2}$ to the negative power supply node VSS (e.g., ground) does not contribute to the current flowing through the output transformer stage 250, the RF output signal level is reduced.

In this configuration, the amount of differential current that flows from the output nodes $N_{OUT1}$ and $N_{OUT2}$ to the output transformer stage 250 can be increased by increasing the number of activated attenuation segments, or decreased by decreasing the number of deactivated attenuation segments. The number (s) of attenuation segments 240-1, . . . , 240-s that are implemented will depend on the desired resolution of gain adjustment. It is to be noted that when activated, the transistors of the signal attenuation stage 240 are configured to operate in saturation mode.

In some embodiments, the first DC offset compensation DAC 260 and the second DC offset compensation DAC 262 are utilized to correct for imbalances between the DC baseband currents $I^+$, $Q^+$, and $Q^-$, under control of a calibration system, such as the calibration control system 190 of FIG. 1. As schematically shown in FIG. 2B, the first DC offset compensation DAC 260 comprises a first output terminal coupled to the drain terminal of the baseband input transistor 221, and a second output terminal coupled to the drain terminal of the baseband input transistor 222. The second DC offset compensation DAC 262 comprises a first output terminal coupled to the drain terminal of the baseband input transistor 223, and a second output terminal coupled to the drain terminal of the baseband input transistor 224.

In this exemplary configuration, in response to a control signal received from a calibration control system, the first DC offset compensation DAC 260 is configured to inject additional currents $I_{C\_1}$ and $I_{C\_2}$ into the $I^+$ and $I^-$ baseband signal paths, as needed. The additional currents $I_{C\_1}$ and $I_{C\_2}$ are added to the respective drain currents $I_{D\_1}$ and $I_{D\_2}$ of the respective baseband input transistors 221 and 222 to thereby equalize the $I^+$ and $I^-$ baseband currents and, thus, significantly reduce or eliminate DC offset between the t and $I^-$ baseband currents that are applied to the input of the I-mixer 230-1. Similarly, in response to a control signal received from the calibration control system, the second DC offset compensation DAC 262 is configured to inject additional currents $I_{C\_3}$ and $I_{C\_4}$ into the $Q^+$ and $Q^-$ baseband signal paths, as needed. The additional currents $I_{C\_3}$ and $I_{C\_4}$ are added to the respective drain currents $I_{D\_3}$ and $I_{D\_4}$ of the baseband input transistors 223 and 224 to thereby equalize the $Q^+$ and $Q^-$ baseband currents and, thus, significantly reduce or eliminate DC offset between the $Q^+$ and $Q^-$ baseband currents that are applied to the input of the Q-mixer 230-2.

It is to be noted that imbalances between the baseband currents can be adjusted via the first and second DC offset compensation DACs 260 and 262, and/or the first and second DAC circuits 121 and 122 in FIG. 1. For example, utilizing the first and second DC offset compensation DACs 260 and 262 ensures that any imbalance (offsets) between the two baseband currents corresponding to a given phase, e.g., {$I^+$ and $I^-$}, and {$Q^+$ and $Q^-$} is minimized. On the other hand, the first and second DAC circuits 121 and 122 (FIG. 1) are preferably utilized to correct for an imbalance between the baseband currents $I^+$ and $Q^+$. Thus, utilizing the first and second DC offset compensation DACs 260 and 262, together with the first and second DAC circuits 121 and 122, provides the ability to correct for imbalances and ensure that all baseband currents $I^+$, $I^-$, $Q^+$, and $Q^-$ are essentially equal in magnitude.

In the exemplary I/Q modulation architecture of the RF signal generator system 200 shown in FIG. 2B, it is desired to eliminate or otherwise substantially minimize imbalance between the baseband I and Q signals for purposes of image rejection. Indeed, an I/Q imbalance can result in an unwanted spectrum at the image frequency. As noted above, the SSB mixer is configured to upconvert an intermediate frequency (IF) of the baseband signals to only one of sideband signal center frequencies of LO+IF or LO−IF, without creating an image of the other sideband signal, which is particularly useful when using low IF frequencies, as frequency-selective filtering is difficult in that case. For example, if a desired RF signal is to be generated at frequency $f_{RF}=f_{LO}-f_{IF}$, then the sideband signal (image signal) at $f_{IF}+f_{LO}$) will be suppressed by the sideband suppression provided by the SSB mixer. However, an imbalance in the amplitude of the baseband I and Q signals can result in the presence of relatively high spectral power for the unwanted spectrum at the image frequency.

Furthermore, for differential I/Q schemes which utilize differential analog I signals (I(t), $\overline{I(t)}$) and differential analog Q signals (Q(t), $\overline{Q(t)}$), an imbalance between the differential analog I signals I(t) and $\overline{I(t)}$ and/or an imbalance between the differential analog Q signals Q(t) and $\overline{Q(t)}$, can result in LO leakage. For example, an imbalance between the differential analog baseband signals I(t) and $\overline{I(t)}$ and/or the differential analog baseband signals Q(t) and $\overline{Q(t)}$ can be a DC offset of the baseband analog signals generated by the DAC stage 120. A DC offset between differential baseband signals means that the signals are not completely complementary due to the existence of a DC term. In the current-commutating mixer stage 230, the DC offset of a complementary baseband signal pair results in a DC term that is multiplied by the LO frequency, so that the output of the mixer stage 230 comprises an unwanted LO frequency component (LO leakage), which should otherwise be suppressed by virtue of the I/Q modulation.

As noted above, in the baseband signal input stage 220, the first differential transistor pair 220-1 is configured to receive the complementary in-phase baseband signals I(t) and $\overline{I(t)}$ (filtered baseband voltage signals), and the second differential transistor pair 220-2 is configured to receive the complementary quadrature-phase baseband signals Q(t) and $\overline{Q(t)}$ (filtered baseband voltage signals) and in response, the first and second differential transistor pairs 220-1 and 220-2 generate current mode signals that are applied to the current-commutating mixer stage 230. In this regard, in the baseband signal input stage 220, matching is critical between the first differential pair of transistors 221 and 222, and between the second differential pair of transistors 223 and 224. In addition, matching is critical between the first differential transistor pair 220-1 and the second differential transistor pair 220-2. Mismatches between the transistors in the baseband signal input stage 220 can cause an imbalance in the I/Q baseband current signals, which can lead to LO leakage and insufficient image rejection.

In some embodiments, the calibration control system 190 of FIG. 1 implements control circuitry and calibration methods for configuring the RF signal generator system 200 to operate in a calibration mode, wherein the calibration control system can measure/estimate the DC baseband currents $I^+$, $I^-$, $Q^+$, and $Q^-$ and determine a difference between the same phase pairs $\{I^+, I^-\}$ and $\{Q^+, Q^-\}$, which provides an indication of DC offsets that lead to LO leakage and determine a difference (imbalance) between the measured $I^+$ and $Q^+$ baseband currents, wherein an imbalance between the $I^+$ and $Q^+$ baseband currents can degrade image rejection, which results in the presence of unwanted sideband spurs.

The utilization of the voltage-mode baseband filter stage 210 in FIG. 2A can provide improved power efficiency of the analog signal path in the RF signal generator system 200 by allowing lower supply voltages (e.g., 500 mV-700 mV) to be utilized for the voltage-mode baseband filter stage 210, which is in contrast to utilizing current-mode baseband filter circuitry which comprises a stacked transistor architecture that may require higher supply voltages (e.g., 900 mV or greater). However, interfacing the voltage-mode baseband filter stage 210 (FIG. 2A) with the current-mode RF output stage 215 (FIG. 2B) is not trivial because directly connecting the voltage-mode outputs of baseband filter transistors to the transistors in the current-mode baseband input stage 220 typically does not provide for suitable biasing of transistors in the current-mode RF output stage 215 (unlike current-mode connections, which are provided between a current-mode baseband filter and current-mode output stage, based on current mirrors). Indeed, the quiescent currents (e.g., $I_{D1}$, $I_{D2}$, $I_{D3}$, and $I_{D4}$) generated by the transistors 221, 222, 223, and 224 of the baseband signal input stage 220 of the current-mode RF output stage 215 in FIG. 2B are especially sensitive to supply voltage variations in instances where the output common-mode of the filter circuits of the voltage-mode baseband filter stage 210 is ground-referenced, while the biasing of the current-mode RF output stage 215 is referenced to the positive supply.

In this regard, exemplary embodiments of the disclosure provide various techniques for interfacing voltage-mode baseband filter circuitry to the current-mode RF output stage 215 of FIG. 2B while ensuring that the quiescent currents (e.g., $I_{D1}$, $I_{D2}$, $I_{D3}$, and $I_{D4}$) generated by the baseband input transistors 221, 222, 223, and 224 in the baseband signal input stage 220 remain constant at target current levels. In general, such techniques provide a mechanism for adjusting the voltage at the source nodes of the first differential transistor pair 220-1, and the source nodes of the second differential transistor pair 220-2, so that baseband input transistors 221, 222, 223, and 224 are biased at the proper gate-to-source voltage ($V_{GS}$) in saturation mode to achieve the desired quiescent current levels (e.g., $I_{D1}$, $I_{D2}$, $I_{D3}$, and $I_{D4}$) for biasing the current-mode RF output stage 215.

FIG. 2B illustrates an exemplary embodiment in which the regulation system 270 is configured to generate a regulated positive supply voltage, denoted VDD_RF_Reg, which is applied to a regulated voltage node, denoted $N_{Reg}$ (alternatively, regulated node $N_{Reg}$) to which the source nodes of the input transistors 221, 222, 223, and 224 are commonly connected. More specifically, in the exemplary embodiment of FIG. 2B, the voltage regulator circuit 272 and the replica bias circuit 274 are configured to operate in conjunction to generate the regulated positive supply voltage VDD_RF_Reg which is applied to the regulated node $N_{Reg}$. In some embodiments, the voltage regulator circuit 272 comprises a low-dropout (LDO) voltage regulator circuit which is configured to receive as input (i) an unregulated positive supply voltage VDD_RF_Unreg and (ii) a reference voltage VDD_Replica which is output from the replica bias circuit 274, and generate the regulated supply voltage VDD_RF_Reg which corresponds to VDD_Replica. An LDO voltage regulator circuit is a DC linear voltage regulator that is configured to regulate the LDO output voltage (VDD_RF_Reg) even when the unregulated positive supply voltage VDD_RF_Unreg is close to the LDO output voltage. In some embodiments, VDD_RF_Unreg is a supply voltage of about 900 mV or less, which is applied from a positive power supply node. The voltage regulator circuit 272 monitors the voltage on the regulated node $N_{Reg}$ and actively adjusts the regulated supply voltage VDD_RF_Reg to ensure that VDD_RF_Reg corresponds to VDD_Replica. In this regard, the regulation system 270 is configured to actively regulate the voltage on the regulated node $N_{Reg}$ to correspond to VDD_Replica, which is set by the replica bias circuit 274.

In some embodiments, the replica bias circuit 274 comprises a replica of circuit components of the voltage-mode baseband filter and of the RF output stack. In this regard, the replica bias circuit 274 will vary depending on the circuit architecture of the voltage-mode baseband filter and the RF output stack. Exemplary embodiments of the voltage-mode baseband filters will now be discussed in further detail in conjunction with FIGS. 3A-3F. In addition, exemplary embodiments of the replica bias circuit 274 will be discussed below in conjunction with, e.g., FIGS. 4, 5B, and 7A.

Figure 3A:
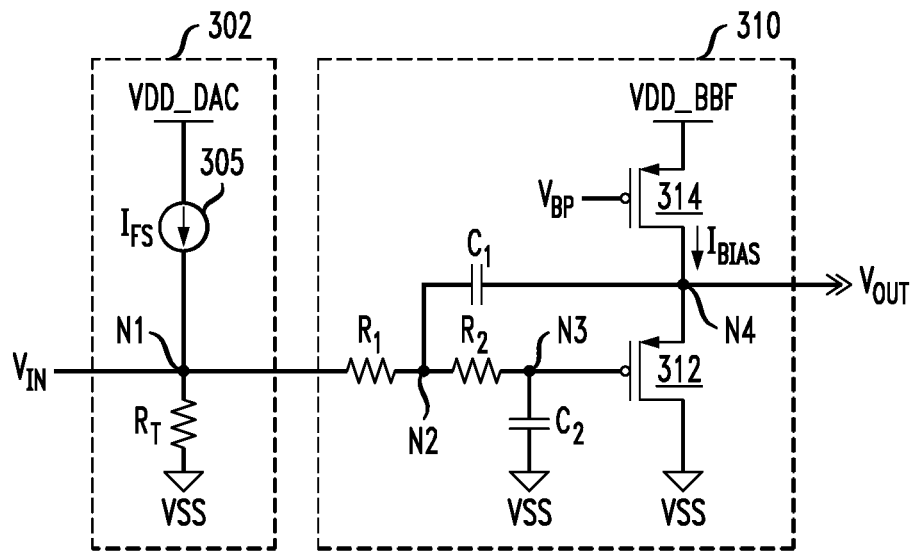
FIG. 3A schematically illustrates a voltage-mode baseband filter circuit, according to an exemplary embodiment of the disclosure.

FIG. 3A schematically illustrates a voltage-mode baseband filter circuit, according to an exemplary embodiment of the disclosure. In particular, FIG. 3A schematically illustrates a voltage-mode baseband filter circuit 300-1 which, in some embodiments, is utilized to implement each of the voltage-mode baseband filter circuits 212-1, 212-2, 214-1, and 214-2 in FIG. 2A. As shown in FIG. 3A, the voltage-mode baseband filter circuit 300-1 comprises an input stage 302 and a filter circuit 310. The input stage 302 comprises a constant current source 305 and a pull-down resistor $R_T$, which are serially connected between a positive power supply node (VDD_DAC) and a negative power supply node (VSS). The input stage 302 is configured to generate a voltage (VIN) at an input to the filter circuit 310. In some embodiments, the constant current source 305 comprises a current steering DAC which generates a DC current $I_{FS}$ (where $I_{FS}$ denotes a full-scale DAC current level). The DC current $I_{FS}$ flows through the pull-down resistor $R_T$ to generate a common-mode DC voltage at an input node N1 of the filter circuit 310. In an exemplary non-limiting embodiment, the resistor $R_T$ has a relatively low resistance value (e.g., about 300 Ohms), and the DC current $I_{FS}$ is set to establish a common-mode input voltage of about 60 millivolts (mV), wherein a baseband voltage signal applied to the input node N1 has a peak-to-peak voltage (VPP) of about 120 mV.

The filter circuit 310 comprises an analog biquadratic low-pass filter framework which comprises a first transistor 312 (e.g., PMOS transistor), a first resistor $R_1$, a second resistor $R_2$, a first capacitor $C_1$, and a second capacitor $C_2$. The filter circuit 310 further comprises a second transistor 314 which serves as a bias transistor. The first resistor $R_1$ is coupled to the input node N1 and to a second node N2 (alternatively, feedback node N2). The second resistor $R_2$ is coupled to the second node N2 and to a third node N3. The first capacitor $C_1$ is coupled to the second node N2 and to a fourth node N4, which provide a feedback path (from node N4 to node N2) of the filter circuit 310. The second capacitor $C_2$ is coupled to the third node N3 and to the negative supply voltage node VSS. The first transistor 312 comprises a gate terminal which is coupled to the third node N3, a source terminal which is coupled to the fourth node N4 (i.e., coupled to the feedback path of the filter circuit 310), and a drain terminal which is coupled to the negative supply voltage node VSS.

As noted above, the second transistor 314 comprises a biasing element which is configured to generate a bias current $I_{BIAS}$ for operating the filter circuit 310 at a given operating point. The second transistor 314 is a PMOS transistor which comprises a gate terminal that receives a bias voltage $V_{BP}$, a source terminal that is coupled to a positive power supply node VDD_BBF, and a drain terminal that is coupled to the fourth node N4. In some embodiments, the bias voltage $V_{BP}$ comprises a DC control voltage that is generated and applied to the gate terminal of the second transistor 314. In some embodiments, the second transistor 314 is a mirror transistor in a current mirror circuit which generates the bias current $I_{BIAS}$ in proportion (e.g., 1:1 ratio, or greater) to a reference current $I_{REF}$, as is understood by those of ordinary skill in the art.

The filter circuit 310 comprises an analog biquadratic low-pass filter framework which is a variation of a low-pass $2^{nd}$ order (2 complex poles) Sallen-Key filter (or positive feedback filter). The Sallen-Key filter configuration in FIG. 3A is implemented using a single transistor 312 in a source follower configuration (providing unity gain), instead of an operational amplifier as is typically implemented in conventional Sallen-Key filter and biquadratic low-pass filter designs. In the filter circuit 310, the filter feedback loop is implemented by coupling the source terminal of the transistor 312 to the feedback node N2 through the first capacitor $C_1$. As compared to conventional biquadratic low-pass filter circuits, the implementation of the Sallen-Key filter circuit 310 based on a source follower provides lower power consumption, low distortion, and a smaller footprint (less occupied area). In addition, by using the voltage-mode baseband filter circuit 300-1, an analog signal path can be implemented in an RF signal generator system with at least the baseband filter stages operating at relatively low supply voltage (e.g., 500 mV to about 800 mV) for low power consumption.

In the exemplary embodiment of FIG. 3A, a voltage output ($V_{OUT}$) of the filter circuit 310 is at taken at the fourth node N4, which is the source terminal of the first transistor 312. In other embodiments, the voltage output of the filter circuit 310 is taken at node N3, which is the gate terminal of the first transistor 312. Without next stage loading, a frequency response H(s) of the filter circuit 310 is nearly identical at the gate and source terminals (nodes N3 and N4), wherein the frequency response is expressed as: $H(s)=\omega_0^2/(s^2+2\alpha s+\omega_0^2)$ where $\omega$ denotes a center frequency expressed as $\omega=1/\sqrt{R_1 R_2 C_1 C_2}$, where $\alpha=-1/2C_1(1/R_1+1/R_2)$, and wherein the filter circuit 310 has a quality factor of $Q=\omega_0/2\alpha$.

Figure 3B:
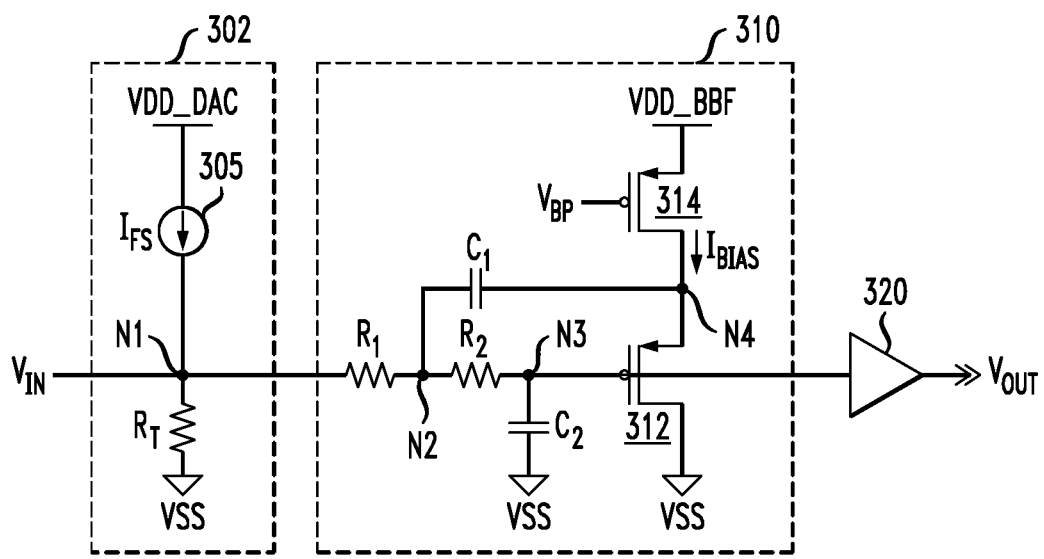
FIG. 3B schematically illustrates a voltage-mode baseband filter circuit, according to another exemplary embodiment of the disclosure.

Next, FIG. 3B schematically illustrates a voltage-mode baseband filter circuit, according to another exemplary embodiment of the disclosure. In particular, FIG. 3B schematically illustrates a voltage-mode baseband filter circuit 300-2 which, in some embodiments, is utilized to implement each of the voltage-mode baseband filter circuits 212-1, 212-2, 214-1, and 214-2 of FIG. 2A. As shown in FIG. 3B, the voltage-mode baseband filter circuit 300-2 is similar to the voltage-mode baseband filter circuit 300-1 of FIG. 3A, except that the voltage-mode baseband filter circuit 300-2 comprises a buffer circuit 320. The buffer circuit 320 comprises an input terminal that is coupled to the gate terminal (node N3) of the first transistor 312, and an output terminal which provides a voltage output ($V_{OUT}$) of the voltage-mode baseband filter circuit 300-2. In some embodiments, the buffer circuit 320 comprises a PMOS source follower buffer.

FIG. 3B illustrates an exemplary embodiment in which the output of the filter circuit 310 is taken at the gate terminal of the first transistor 312, whereas in FIG. 3A, the output of the filter circuit 310 is taken at the source terminal of the first transistor 312. As noted above, the frequency response of the filter circuit 310 at the gate and source terminals of the first transistor 312 are similar, except that the frequency response at the gate terminal of the first transistor 312 is sharper (e.g., sharper cutoff) than the frequency response at the source terminal of the first transistor 312. However, the output impedance of the filter circuit 310 varies with frequency, which can lead to a degraded filter response. The buffer circuit 320 serves to buffer the output of the filter circuit 310 and provide a low output impedance over a wide frequency range and unity gain.

Next, FIG. 3C schematically illustrates a voltage-mode baseband filter circuit, according to another exemplary embodiment of the disclosure. In particular, FIG. 3C schematically illustrates a voltage-mode baseband filter circuit 300-3 which, in some embodiments, is utilized to implement each of the voltage-mode baseband filter circuits 212-1, 212-2, 214-1, and 214-2 of FIG. 2A. As shown in FIG. 3C, the voltage-mode baseband filter circuit 300-3 is similar to the voltage-mode baseband filter circuit 300-1 of FIG. 3A, except that the voltage-mode baseband filter circuit 300-3 comprises a cascade of multiple stages of the filter circuit 310. In particular, the voltage-mode baseband filter circuit 300-3 comprises a first filter stage 310-1 and a second filter stage 310-2, wherein each filter stage 310-1 and 310-2 comprises a Sallen-Key filter circuit configuration as the filter circuit 310 of FIG. 3A.

More specifically, the first filter stage 310-1 is a Sallen-Key filter circuit which comprises a first transistor 312-1, first and second resistors $R_1$ and $R_2$, and first and second capacitors $C_1$ and $C_2$, which have the same connection topology as the filter circuit 310 of FIG. 3A. In addition, the second filter stage 310-2 is a Sallen-Key filter circuit which comprises a first transistor 312-2, first and second resistors $R_{12}$ and $R_{22}$, and first and second capacitors $C_{12}$ and $C_{22}$, which have the same connection topology as the filter circuit 310 of FIG. 3A. Further, the first and second filter stages 310-1 and 310-2 comprise respective bias transistors 314-1 and 314-2 having commonly connected gate terminals to receive the bias voltage $V_{BP}$. In the exemplary embodiment of FIG. 3C, an output node N3 of the first filter stage 310-1 (i.e., the gate terminal of the first transistor 312-1) is directly coupled to the input of the second filter stage 310-2, and the voltage output ($V_{OUT}$) of the second filter stage 310-2 is at taken at the fourth node N4, which is the source terminal of the first transistor 312-2. In other embodiments, the voltage output ($V_{OUT}$) of the second filter stage 310-2 can be taken at the third node N3, which is the gate terminal of the first transistor 312-2.

Due to the filter architecture, the direct coupling of the first and second filter stages 310-1 and 310-2 is sufficient to achieve a higher order filter, without the need to implement level-shifters or complementary filter stages because the common-mode output at node N3 of the first filter stage 310-1 is essentially the same as the common-mode input at node N1 of the first filter stage 310-1. In this regard, while only two filter stages 310-1 and 310-2 are shown in FIG. 3C, it is to be understood that a voltage-mode baseband filter circuit can be implemented by cascading three or more Sallen-Key filter stages through direct DC coupling, since the common-mode voltage at each gate terminal (node N3)

of each Sallen-key filter transistor (e.g., 312-1, 312-2, . . . etc.) of each filter stage will have essentially the same common-mode voltage input at node N1 of the first filter stage (e.g., filter stage 310-1).

Next, FIG. 3D schematically illustrates a voltage-mode baseband filter circuit, according to another exemplary embodiment of the disclosure. In particular, FIG. 3D schematically illustrates a voltage-mode baseband filter circuit 300-4 which, in some embodiments, is utilized to implement each of the voltage-mode baseband filter circuits 212-1, 212-2, 214-1, and 214-2 of FIG. 2A. As shown in FIG. 3D, the voltage-mode baseband filter circuit 300-4 is similar to the voltage-mode baseband filter circuit 300-3 of FIG. 3C, except that the voltage-mode baseband filter circuit 300-4 comprises a buffer circuit 330, wherein the buffer circuit 330 couples the output of the first filter stage 310-1 to the input of the second filter stage 310-2.

In some embodiments, the buffer circuit 330 is configured to shift the common-mode voltage to a target level, and provide a low output impedance over a wide frequency range and unity gain to thereby preserve a higher-order cascaded filter frequency response. In addition, in some embodiments, the buffer circuit 330 is configured to provide an additional pole which increases the order of the voltage-mode baseband filter circuit 300-4 to thereby provide a sharper filter response. In some embodiments, the buffer circuit 330 comprises a PMOS source follower buffer, while in other embodiments, the buffer circuit 330 comprises an NMOS source follower buffer.

Next, FIG. 3E schematically illustrates a voltage-mode baseband filter circuit, according to another exemplary embodiment of the disclosure. In particular, FIG. 3E schematically illustrates a voltage-mode baseband filter circuit 300-5 which, in some embodiments, is utilized to implement each of the voltage-mode baseband filter circuits 212-1, 212-2, 214-1, and 214-2 of FIG. 2A. As shown in FIG. 3E, the voltage-mode baseband filter circuit 300-5 is similar to the voltage-mode baseband filter circuit 300-4 of FIG. 3D, except that the voltage-mode baseband filter circuit 300-5 further comprises a third filter stage 310-3, and a second buffer circuit 340 which couples the output of the second filter stage 310-2 to the input of the third filter stage 310-3.

The third filter stage 310-3 is a Sallen-Key filter circuit which comprises the same filter architecture as the first and second filter stages 310-1 and 310-2. In particular, the third filter stage 310-3 comprises a first transistor 312-3, first and second resistors $R_{13}$ and $R_{23}$, and first and second capacitors $C_{13}$ and $C_{23}$. In addition, the third filter stage 310-3 comprises a bias transistor 314-3 having a gate terminal that is commonly connected to the gate terminals of the bias transistors 314-1 and 314-2 in the first and second filter stages 310-1 and 310-2 to receive the bias voltage $V_{BP}$.

In some embodiments, the first and second buffer circuits 330 and 340 are configured to provide a low output impedance (of the filter stages) over a wide frequency range and unity gain to thereby preserve a higher-order cascaded filter frequency response. In addition, in some embodiments, the first buffer circuit 330 and/or the second buffer circuit 340 can be configured to provide an additional pole which increases the order of the voltage-mode baseband filter circuit 300-5 to thereby provide a sharper filter response. In some embodiments, to maintain a constant common-mode voltage across the filter stages 310-1, 310-2, and 310-3, the first buffer circuit 330 comprises a PMOS source follower buffer, and the second buffer circuit 340 comprises an NMOS source follower buffer. In this regard, while the first buffer circuit 330 increases the common-mode output voltage of the first filter stage 310-1 by an amount of $V_{GS}$ of a PMOS source follower transistor of the first buffer circuit 330, the second buffer circuit 340 decreases the common-mode output voltage of the second filter stage 310-2 by an amount of $V_{GS}$ of an NMOS source follower transistor of the second buffer circuit 340. Assuming that the $V_{GS}$ of the PMOS source follower is close in magnitude to the $V_{GS}$ of the NMOS source follower, the common-mode input voltage at the input of the third filter stage 310-3 will be approximately equal to the common-mode input voltage at the input node N1 of the first filter stage 310-1.

Next, FIG. 3F schematically illustrates a voltage-mode baseband filter circuit, according to another exemplary embodiment of the disclosure. In particular, FIG. 3F schematically illustrates a voltage-mode baseband filter circuit 300-6 which, in some embodiments, is utilized to implement each of the voltage-mode baseband filter circuits 212-1, 212-2, 214-1, and 214-2 of FIG. 2A. As shown in FIG. 3F, the voltage-mode baseband filter circuit 300-6 is similar to the voltage-mode baseband filter circuit 300-5 of FIG. 3E, except that the voltage-mode baseband filter circuit 300-6 further comprises a third buffer circuit 350 having an input terminal that is coupled to the output node N3 (i.e., gate terminal of the first transistor 312-3) of the third filter stage 310-3. In addition, an output terminal of the third buffer circuit 350 generates the output voltage $V_{OUT}$ of the voltage-mode baseband filter circuit 300-6. In some embodiments, the third buffer circuit 350 comprises a PMOS source follower which increases the common-mode output voltage of the third filter stage 310-3 by an amount of $V_{GS}$ of a PMOS source follower transistor of the third buffer circuit 350.

It should be noted that the exemplary voltage-mode baseband filter circuits shown in FIGS. 3A-3F provide various advantages. For example, the exemplary voltage-mode baseband filter circuits provide circuit architectures which can be utilized with relatively low positive power supply voltages (e.g., 500 mV to 850 mV). In addition, the Sallen-Key filter architecture enables efficient cascading of multiple filter stages through direct DC coupling (e.g., FIG. 3C) to achieve higher order filters, without the need to implement additional circuitry to match the common-mode input and output voltage. For example, in the exemplary embodiment of FIG. 3C, multiple Sallen-Key filter stages can be cascaded by direct coupling of the gate terminals of the first transistors (e.g., transistor 312-1 and 312-2) of the filter stages, such that the common-mode input voltages will match the common-mode output voltages of all the filter stages at the gate nodes of the first transistors (since the gate terminals of the first transistors essentially draw no current). In addition, the utilization of buffer circuits to couple the inputs and outputs of cascaded filter stages provides lower power elements that provide additional poles to enhance the overall frequency response of the voltage-mode baseband filter circuit, while providing the necessary DC voltage shifts along the cascaded filter stages for matching common-mode voltages, as needed.

Figure 4:
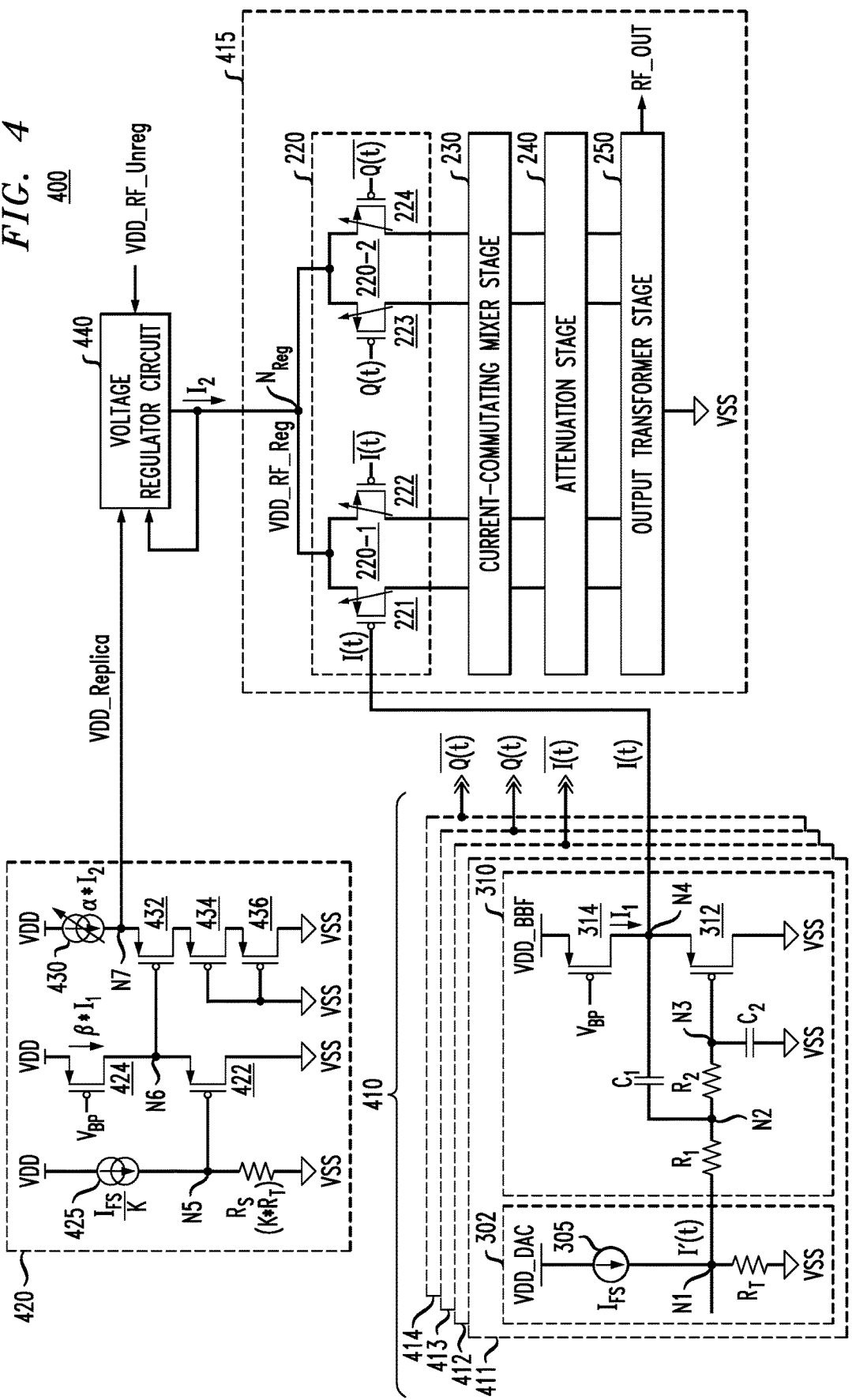
FIG. 4 schematically illustrates a radio frequency signal generator system, according to another exemplary embodiment of the disclosure.

FIG. 4 schematically illustrates a radio frequency signal generator system, according to another exemplary embodiment of the disclosure. More specifically, FIG. 4 schematically illustrates an RF signal generator system 400 which comprises a voltage-mode baseband filter stage 410, a current-mode RF output stage 415, a replica bias circuit 420, and a voltage regulator circuit 440, according to an exemplary embodiment of the disclosure. The voltage-mode baseband filter stage 410 comprises a plurality of single-ended voltage-mode baseband filter circuits 411, 412, 413, and 414. In some embodiments, such as shown in FIG. 4, each of the single-ended voltage-mode baseband filter circuits 411, 412, 413, and 414 implements an instance of the voltage-mode baseband filter circuit 300-1 of FIG. 3A, as discussed above, which comprises a Sallen-Key filter 310 using a single transistor 312 in a source follower configuration (with unity gain), wherein the filter output is taken from the source node (e.g., node N4) of the transistor 312. In addition, in the exemplary embodiment of FIG. 4, the current-mode RF output stage 415 implements the current-mode RF output stage 215 of FIG. 2B, as discussed above.

The single-ended voltage-mode baseband filter circuit 411 receives an unfiltered baseband voltage signal I'(t) and outputs a filtered baseband voltage signal I(t) on the output node of the baseband filter circuit 411. The single-ended voltage-mode baseband filter circuit 412 receives an unfiltered baseband voltage signal $\overline{I'(t)}$ and outputs a filtered baseband voltage signal $\overline{I(t)}$ on the output node of the baseband filter circuit 412. The single-ended voltage-mode baseband filter circuit 413 receives an unfiltered baseband voltage signal Q'(t) and outputs a filtered baseband voltage signal Q(t). The single-ended voltage-mode baseband filter circuit 414 receives an unfiltered baseband voltage signal $\overline{Q'(t)}$ and outputs a filtered baseband voltage signal $\overline{Q(t)}$.

The output nodes of the single-ended voltage-mode baseband filter circuits 411, 412, 413, and 414 are directly connected (DC-coupled) to the gate terminals of the respective baseband input transistors 221, 222, 223, and 224 of the baseband signal input stage 220. For ease of illustration, FIG. 4 depicts the direct connection from the output node N4 of the single-ended voltage-mode baseband filter circuit 411 to the gate terminal of the baseband input transistor 221. As noted above, it is a challenge to interface the voltage-mode baseband filter stage 410 with the current-mode RF output stage 415 through direct connections (DC coupling) from the output nodes of the single-ended voltage-mode baseband filter circuits 411, 412, 413, and 414 to the gate terminals of the respective baseband input transistors 221, 222, 223, and 224 of the baseband signal input stage 220.

In particular, the DC biasing of the baseband input transistors 221, 222, 223, and 224 of the baseband signal input stage 220 is based on the $V_{GS}$ bias voltages of the baseband input transistors 221, 222, 223, and 224, wherein the $V_{GS}$ biasing is referenced to the positive power supply VDD. On the other hand, the output common-mode voltages of the single-ended voltage-mode baseband filter circuits 411, 412, 413, and 414 are essentially ground-referenced (referenced to VSS) and, thus, do not rely on the positive power supply. In this regard, since the output common-mode voltages of the single-ended voltage-mode baseband filter circuits 411, 412, 413, and 414 are directly applied to the gate terminals of the respective baseband input transistors 221, 222, 223, and 224, variations in the positive power supply voltage VDD will result in $V_{GS}$ voltage variations of the baseband input transistors 221, 222, 223, and 224, which, in turn, results in variations in the quiescent currents (or bias currents) that flow in the analog I/Q signal paths of the current-mode RF output stage 415. Indeed, since the $V_{GS}$ biasing of the baseband input transistors 221, 222, 223, and 224 is based on the difference between the output common-mode voltages of the single-ended voltage-mode baseband filter circuits 411, 412, 413, and 414 and the power supply voltage VDD, the DC bias currents generated by the baseband input transistors 221, 222, 223, and 224 are highly sensitive to variations in the power supply voltage VDD, which can result in unstable bias points of the current-mode RF output stage 415.

In the exemplary embodiment of FIG. 4, the replica bias circuit 420 and the voltage regulator circuit 440 provide a system to enable the interfacing of the voltage-mode baseband filter stage 410 with the current-mode RF output stage 415, while providing a well-controlled bias point for the current-mode RF output stage 415. In particular, as noted above, the voltage regulator circuit 440 and replica bias circuit 420 are configured to regulate the power supply voltage VDD_RF_Reg that is applied to the regulated node $N_{Reg}$ to which the source nodes of the input transistors 221, 222, 223, and 224 are commonly connected. The replica bias circuit 420 is configured to generate a reference voltage, VDD_Replica, which is input to the voltage regulator circuit 440 and utilized to generate a regulated voltage VDD_RF_Reg on the regulated node $N_{Reg}$, relative to the output common-mode voltage levels on the output nodes of the single-ended voltage-mode baseband filter circuits 411, 412, 413, and 414 to thereby maintain a constant $V_{GS}$ for the input transistors 221, 222, 223, and 224 and, thus, maintain a well-controlled quiescent current in the signal paths of the current-mode RF output stage 415 to achieve a stable bias point of the current-mode RF output stage 415.

The replica bias circuit 420 comprises replica elements of the baseband filter circuitry 410 and the current-mode RF output stage 415. For example, in the exemplary embodiment of FIG. 4, the replica bias circuit 420 comprises a first replica current source 425 (e.g., current mirror 425), a replica resistor $R_S$, replica transistors 422, 424, 432, 434, and 436, and a second replica current source 430 (e.g., current mirror 430). The first replica current source 425 and the replica resistor $R_S$ correspond to the current source 305 and the resistor $R_T$, respectively, of one instance of the input stage 302 of the baseband filter circuitry 410. The replica transistors 422 and 424 correspond to the transistors 312 and 314, respectively, of one instance of the filter circuit 310 of the baseband filter circuitry 410. The replica transistor 432 corresponds to baseband input transistors of the baseband input stage 220. The replica transistor 434 corresponds to LO switching transistors in the current-commutating mixer stage 230. The replica transistor 436 corresponds to transistors in the attenuation stage 240. It is to be noted that because the DC voltage drop across the output transformer stage 250 is negligible, the wiring resistance of the output transformer stage 250 does not need to be included in the replica bias circuit 420.

The first replica current source 425 is configured to generate a bias current of magnitude $I_{FS}/K$, where $I_{FS}$ denotes a full-scale DAC current, and K denotes a scalar multiplier, where K>>1. The replica resistor $R_S$ has a resistance value of $K*R_T$. In this regard, the first replica current source 425 and replica resistor $R_S$ are configured to generate an input common-mode voltage on node N5 of the replica bias circuit 420 which matches the input common-mode voltage that is generated by the input stage 302 and applied to the input of the filter circuit 310. The input common-mode voltage on node N5 biases the gate terminal of the replica transistor 422. The replica bias circuit 420 is configured to generate a bias current of magnitude $\beta*I_1$ which flows in the current path through the replica transistors 424 and 422 (which operate in saturation mode), where $I_1$ denotes the bias current of the filter circuit 310 which flows through the transistors 314 and 312 operating in saturation mode, and $\beta$ denotes a scalar multiplier, where $\beta<<1$.

The second replica current source 430 is configured to generate a bias current of magnitude $\alpha*I_2$ which flows in the current path through the replica transistors 432, 434, and 436, where $I_2$ denotes the desired bias current of the current-mode RF output stage 415, and α denotes a scalar multiplier, where α<<1. In the replica bias circuit 420, the replica transistors 432 and 436 are configured to operate in saturation mode (similar to the transistors in the baseband signal input stage 220 and attenuation stage 240), while the replica transistor 434 is configured to operate in triode mode (similar to the mixing transistors in the current-commutating mixer stage 230). In some embodiments, the second replica current source 430 is a variable current source which allows for adjustment of the bias current of magnitude α*I₂ in response to an adjustment of the desired bias current I₂ of the current-mode RF output stage 415, such as when the gain of the baseband input stage 220 is scaled (increased or decreased) to change the output amplitude of the RF output signal.

The replica transistors 422, 424, 432, 434, and 436 have width/length (W/L) dimension ratios that are designed based on the W/L dimension ratios of the corresponding transistors in the current-mode stages. For example, the W/L dimension ratios of the replica transistors are designed accordingly based on the following: α(W/L), where W/L denotes the dimension ratio of the circuit transistors, and α denotes a scaling factor. In particular, the replica transistors 432, 434, and 436 in the replica bias circuit 420 are scaled versions of corresponding transistors in baseband input stage 220, the current-commutating mixer stage 230, and the attenuation stage 240. The replica transistors are scaled by the same scaling factor α to ensure that the current density remains the same between the current-mode RF output stage 415 and the replica bias circuit 420.

The dimensions of the replica transistors 422 and 424 are configured so that the replica bias circuit 420 generates a voltage on node N6 which corresponds to the output common-mode voltages generated on the nodes N4 of the single-ended voltage-mode baseband filter circuits 411, 412, 413, and 414, which are applied to the gate terminals of the respective baseband input transistors 221, 222, 223, and 224. In addition, the dimensions of the replica transistors 432, 434, and 436 are configured so that the replica bias circuit 420 generates the reference voltage, VDD_Replica, on node N7, which corresponds to the voltage that needs to be applied to the regulated node $N_{Reg}$, relative to the output common-mode voltages of the single-ended voltage-mode baseband filter circuits 411, 412, 413, and 414 to establish the proper $V_{GS}$ bias voltages for baseband input transistors 221, 222, 223, and 224 to obtain a constant and stable bias current I₂ that is generated by the baseband signal input stage 220 to properly bias the current-mode RF output stage 415.

Figure 5A:
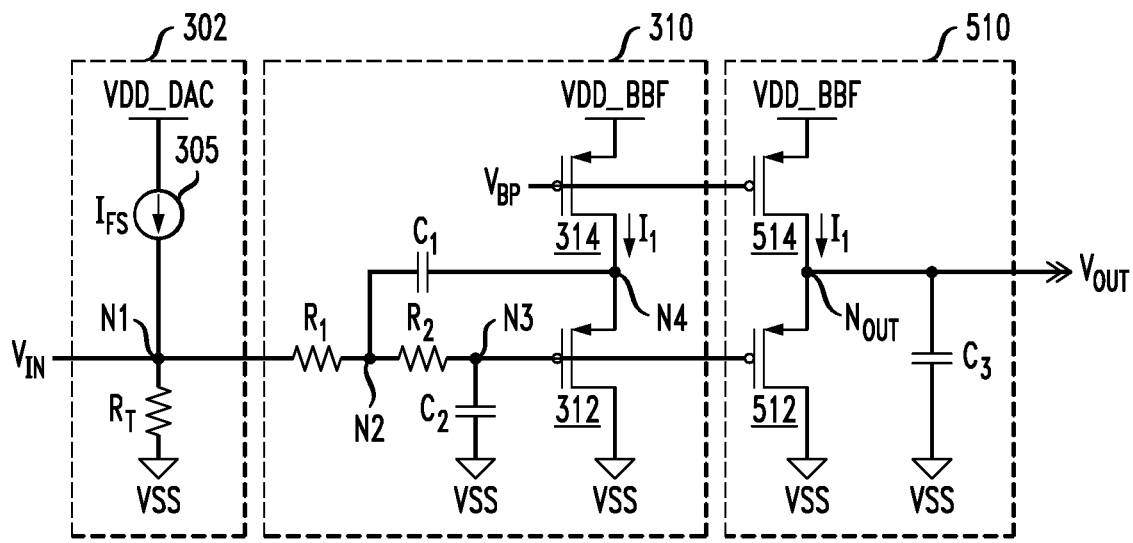
FIG. 5A schematically illustrates a voltage-mode baseband filter circuit which can be implemented in the radio frequency signal generator system of FIG. 4, according to another exemplary embodiment of the disclosure.
Figure 5B:
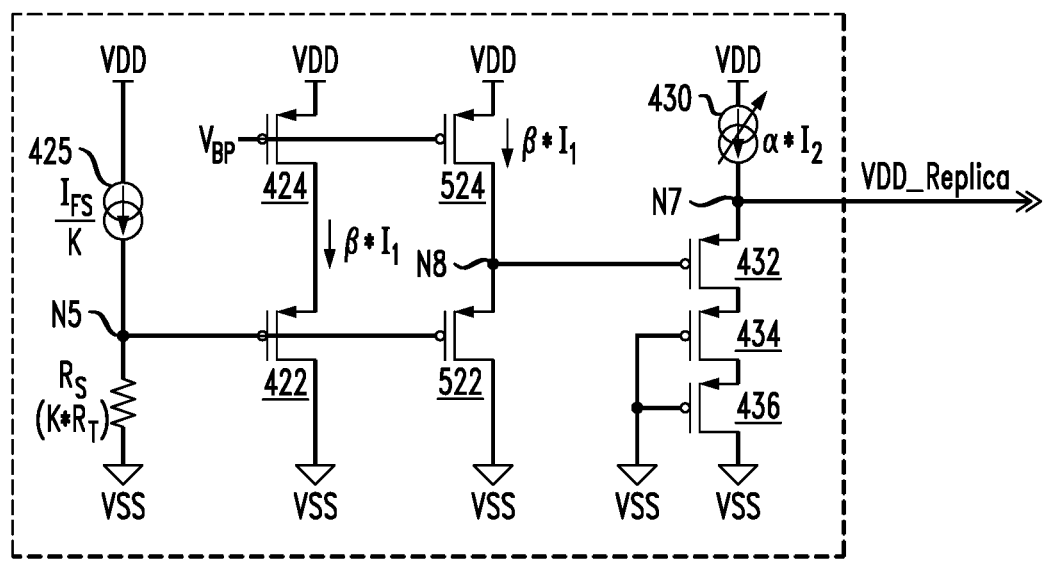
FIG. 5B schematically illustrates a replica bias circuit which can be implemented in the radio frequency signal generator system of FIG. 4, according to another exemplary embodiment of the disclosure.

In other embodiments, the single-ended voltage-mode baseband filter circuits 411, 412, 413, and 414 in FIG. 4 can be implemented using instances of the voltage-mode baseband filter circuits shown in FIG. 3B, 3C, 3D, 3E, or 3F, etc. In addition, the replica bias circuit 420 in FIG. 4 would be modified to provide replica components corresponding to the filter circuitry. For example, FIGS. 5A and 5B schematically illustrate an exemplary voltage-mode baseband filter circuit 500 and replica bias circuit 520, which can be implemented in the RF signal generator system 400, according to another exemplary embodiment of the disclosure. In particular, the voltage-mode baseband filter circuit 500 of FIG. 5A schematically illustrates an exemplary embodiment of the voltage-mode baseband filter circuit 300-2 of FIG. 3B. The voltage-mode baseband filter circuit 500 is similar to the voltage-mode baseband filter circuit 300-2, and shows details of an exemplary configuration of the buffer circuit 320.

More specifically, the voltage-mode baseband filter circuit 500 comprises a buffer circuit 510 which comprises PMOS transistors 512 and 514, and a capacitor C₃. The buffer circuit 510 comprises a PMOS source follower buffer circuit in which a gate terminal of the PMOS transistor 512 is coupled to the output node N3 of the filter circuit 310. The PMOS transistor 514 operates as a current source to generate a bias current I₁ which matches the bias current I₁ generated by the PMOS transistor 314 of the filter circuit 310. The PMOS transistor 512 comprises a source terminal that is coupled to an output node $N_{OUT}$ of the buffer circuit 510, which serves as the output node of the voltage-mode baseband filter circuit 500. The capacitor C₃ is coupled to the output node $N_{OUT}$ and to the negative power supply node VSS. As noted above, the addition of the source follower buffer circuit 510 provides an additional filter pole to increase the order of the baseband filter and allows the filter output to have a sharper frequency response, while providing a low output impedance to drive the next stage.

The replica bias circuit 520 of FIG. 5B is similar to the replica bias circuit 420 of FIG. 4, except that the replica bias circuit 520 comprises additional replica components corresponding to the source follower buffer circuit 510 of FIG. 5A. More specifically, the replica bias circuit 520 comprises replica transistors 522 and 524, which correspond to the PMOS transistors 512 and 514, respectively, of the source follower buffer circuit 510. The replica bias circuit 520 is configured to generate a bias current of magnitude β*I₁ which flows in the current path through the replica transistors 524 and 522 (which operate in saturation mode). The replica bias circuit 520 is configured to generate a voltage on node N8 (which corresponds to the output node $N_{OUT}$ of the buffer circuit 510), wherein the voltage generated on node N8 corresponds to the output common-mode voltages that are applied to the gate terminals of the baseband input transistors 221, 222, 223, and 224 of the baseband signal input stage 220.

As noted above, the exemplary voltage-mode baseband filter circuits shown in FIGS. 3A-3F provide low voltage filter topologies that can improve power efficiency of the analog signal paths of an RF signal generator system by allowing the use of lower supply voltages (e.g., 500 mV-700 mV). In other embodiments, the architecture of the exemplary current-mode RF output stage 215 as shown in FIG. 2B is modified using different topologies and signal processing techniques to effectively decrease the height of the current-mode transistor stack and thereby allow the use of lower supply voltage (e.g., less than 900 mV) for the RF output stage.

Figure 6:
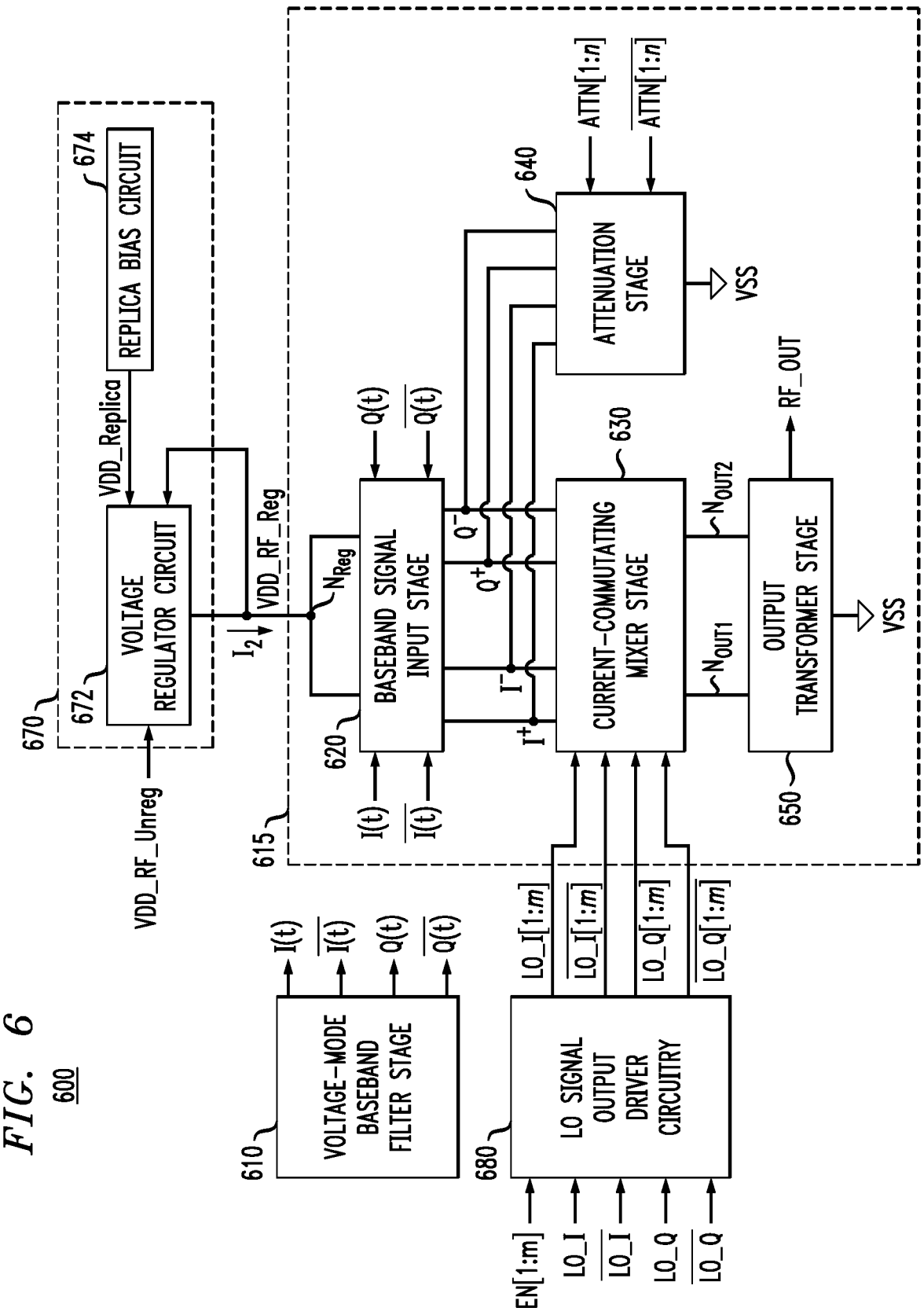
FIG. 6 schematically illustrates a radio frequency signal generator system, according to another exemplary embodiment of the disclosure.

For example, FIG. 6 schematically illustrates an RF signal generator system 600 according to another exemplary embodiment of the invention, which comprises an RF output stack that is configured to operate at a reduced power supply voltage. More specifically, the RF signal generator system 600 comprises voltage-mode baseband filter stage 610, and a current-mode RF output stage 615 which comprises a baseband signal input stage 620, a current-commutating mixer stage 630, an attenuation stage 640, and an output transformer stage 650. The RF signal generator system 600 further comprises a regulation system 670 and LO signal output driver circuitry 680. The regulation system 670 comprises a voltage regulator circuit 672, and a replica bias circuit 674.

The exemplary current-mode RF output stage 615 is configured to operate at a lower VDD_RF supply voltage by placing the current-commutating mixer stage 630 and the attenuation stage 640 at the same level in the stack structure of the current-mode RF output stage 615. In this exemplary configuration, the LO switching transistors of the current-commutating mixer stage 630 and the attenuation transistors of the attenuation stage 640 are connected to the output of the baseband signal input stage 620, and operate at the same level of the current-mode RF output stage 615. In addition, the output nodes $N_{OUT1}$ and $N_{OUT2}$ of the current-commutating mixer stage 630 are directly coupled to the output transformer stage 650. In the exemplary stack configuration shown in FIG. 6, the LO switching transistors of the current-commutating mixer stage 630 are biased in saturation mode.

The exemplary stack structure of the RF output stage effectively reduces the "height" of the stack structure (e.g., reduces the number of transistors in the analog signal paths from the baseband input stage 620 to the output transformer stage 650). This is in contrast to the exemplary stack structure of the current-mode RF output stage 215 of FIG. 2B, where the current-commutating mixer stage 230 is stacked over the attenuation stage 240, where the output nodes $N_{OUT1}$ and $N_{OUT2}$ of the current-commutating mixer stage 230 are directly coupled to inputs of the attenuation stage 240, and where the LO switching transistors of the current-commutating mixer stage 230 are biased in triode mode.

For a complementary quadrature architecture, similar to the exemplary embodiments shown in, e.g., FIGS. 2A and 4, the voltage-mode baseband filter stage comprises four single-ended voltage-mode baseband filter circuits that are configured to output filtered baseband voltage signals I(t), $\overline{I(t)}$, Q(t), and $\overline{I(t)}$, which are applied to gate terminals of transistors in the baseband signal input stage 620. The regulation system 670 performs the same or similar functions as discussed above, except that the replica bias circuit 674 comprises replica devices and topologies configured to generate the reference voltage VDD_Replica based on replica devices and topologies of the voltage-mode baseband filter circuits, the current-commutating mixer stage 630, and the attenuation stage 640. An exemplary embodiment of the replica bias circuit 674 will be discussed below in conjunction with FIG. 7A.

In some embodiments, the mixing and attenuation functions are implemented at the same level in the stack structure of the current-mode RF output stage 615, wherein the current-commutating mixer stage 630 is configured to upconvert a quadrature baseband signal to an RF signal, and wherein the current-commutating mixer stage 630 and attenuation stage 640 operate in conjunction to attenuate the RF signal using a current-splitting attenuation scheme. For example, in some embodiments, the current-commutating mixer stage 630 comprises an array of mixer quad segments (e.g., m segments for the differential I mixer and for the differential Q mixer), and the attenuation stage 640 comprises a parallel array of attenuator segments (e.g., n segments for I and Q signal paths), wherein the array of mixer quad segments and the array of attenuator segments are connected to each of the current signal output nodes (e.g., I$^+$, I$^-$, Q$^+$, Q$^-$) of the baseband signal input stage 620. When a given attenuator segment is activated, the given attenuator segment will shunt a portion of the I/Q current signal to ground. To obtain a target attenuation factor, a target number of mixer segments in the current-commutating mixer stage 630 are disabled, and a target number of shunt attenuator segments in the attenuation stage 640 are enabled, wherein the attenuation factor is determined as a ratio of the number of active mixer segments to the number of active shunting attenuator segments.

The LO signal output driver circuitry 680 is configured to apply voltage signals to gate terminals of the LO switching transistors of the mixer quad segments to selectively activate and deactivate the mixer quad segments as desired to achieve a target attenuation factor. For example, as schematically shown in FIG. 6, the LO signal output driver circuitry 680 receives as input a control signal EN [1:m], and complementary quadrature LO signals LO_I, LO_Q, $\overline{LO\_I}$, and $\overline{LO\_Q}$, which are generated and output from, e.g., the LO signal generator circuitry 170 (FIG. 1). In some embodiments, the LO signal output driver circuitry 680 comprises (i) a first set of m buffers that drive m versions (e.g., LO_I [1:m]) of the LO signal LO_I, (ii) a second set of m buffers that drive m versions (e.g., $\overline{LO\_I}$ [1:m]) of the LO signal $\overline{LO\_I}$, (iii) a third set of m buffers that drive m versions (e.g., LO_Q [1:m]) of the LO signal LO_Q, and (ii) a fourth set of m buffers that drive m versions (e.g., $\overline{LO\_Q}$ [1:m]) of the LO signal $\overline{LO\_Q}$.

As explained in further detail below, the LO signals that are generated by the LO signal output driver circuitry 680 at any given time may comprise LO switching signals which are applied to the gate terminals of mixer quad segments that are to be enabled (activated) for use in mixing functions, and DC voltage signals (e.g., logic "1" voltage level) which are applied to gate terminals of mixer quad segments that are selected to be disabled (deactivated) for purposes of achieving a target attenuation factor. The control signal EN [1:m] specifies which mixer quad segments of the differential I and Q mixers to drive with LO switching signals to perform I/Q mixer functions, and which mixer quad segments of the I and Q mixers to drive with static logic "1" voltages to disable such mixer quad segments to achieve a target attenuation factor.

As further shown in FIG. 6, the attenuation stage 640 is controlled by complementary control signals ATTN[1: n] and $\overline{ATTN}$[1: n]. The attenuation stage 640 comprises n attenuation segments for the I signal path and n attenuation segments for the Q signal path. The control signals EN [1:m], ATTN[1: n], and $\overline{ATTN}$[1: n] are generated by, e.g., the calibration control system 190 (FIG. 1) in a coordinated manner to achieve a target attenuation factor. For example, a blanking function can be implemented by driving all LO inputs to the mixer segments at a logic "1" level to thereby disable the I and Q mixers, and by driving all inputs to the attenuation segments at a logic "0" level to thereby enable all parallel attenuation segments to shunt the baseband current signals (I$^+$, I$^-$, Q$^+$, Q$^-$) to ground (VSS). The exemplary current-steering method for implementing the blanking function is advantageous over conventional systems that implement a voltage-gated blanking function which introduces signal loss and loading to the main signal.

On the other hand, to achieve a target attenuation factor, a certain number of mixer quad segments are configured to upconvert a portion of the I/Q baseband signal current by driving the inputs to such mixer quad segments with LO switching signals, while driving the inputs to the remaining mixer quad segments with static voltages of logic "1" level, and activating a certain number of attenuation segments to shunt the remaining portions of the I/Q baseband signal currents to ground.

Figure 7A:
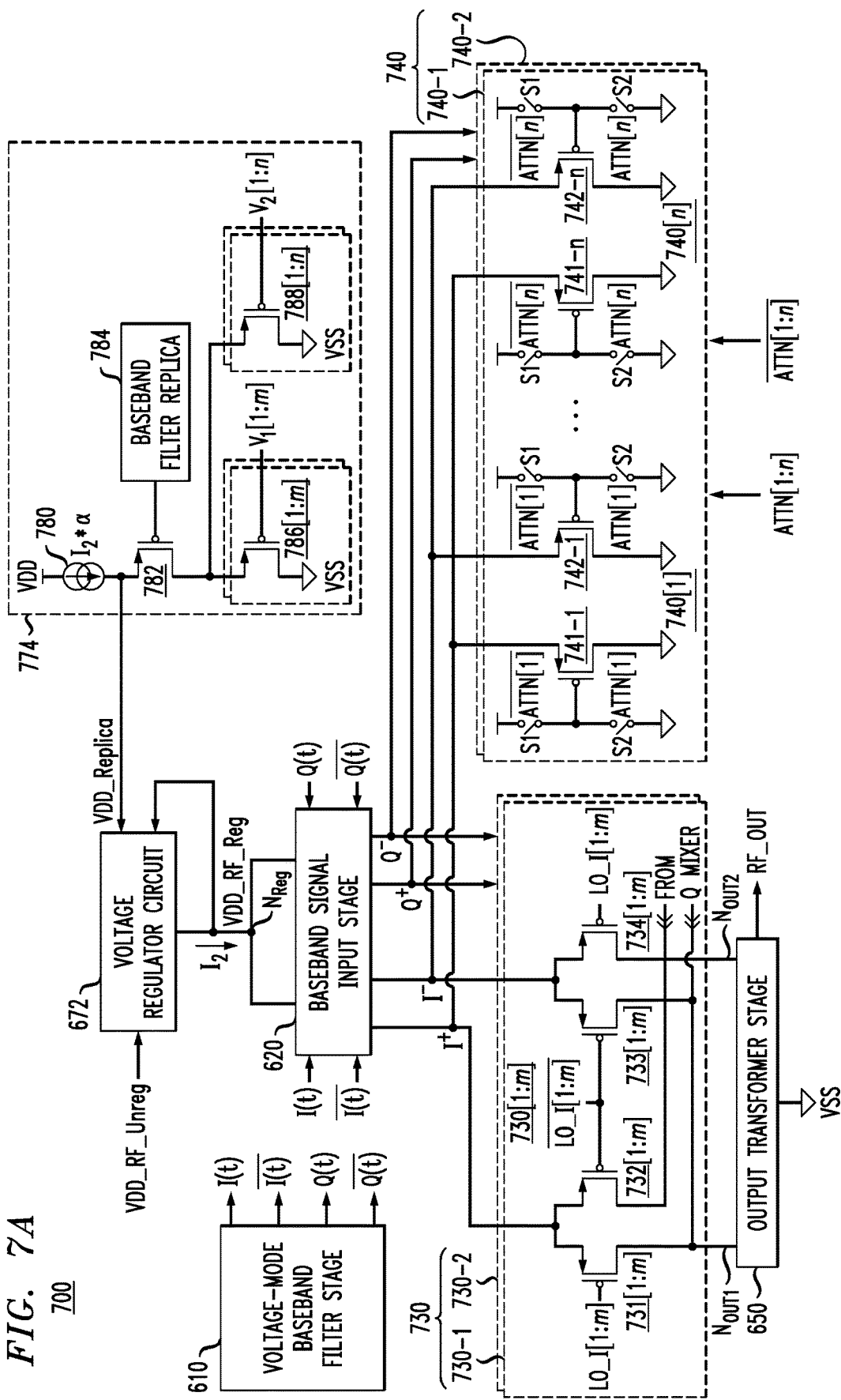
FIGS. 7A and 7B schematically illustrate a radio frequency signal generator system according to another exemplary embodiment of the disclosure.
Figure 7B:
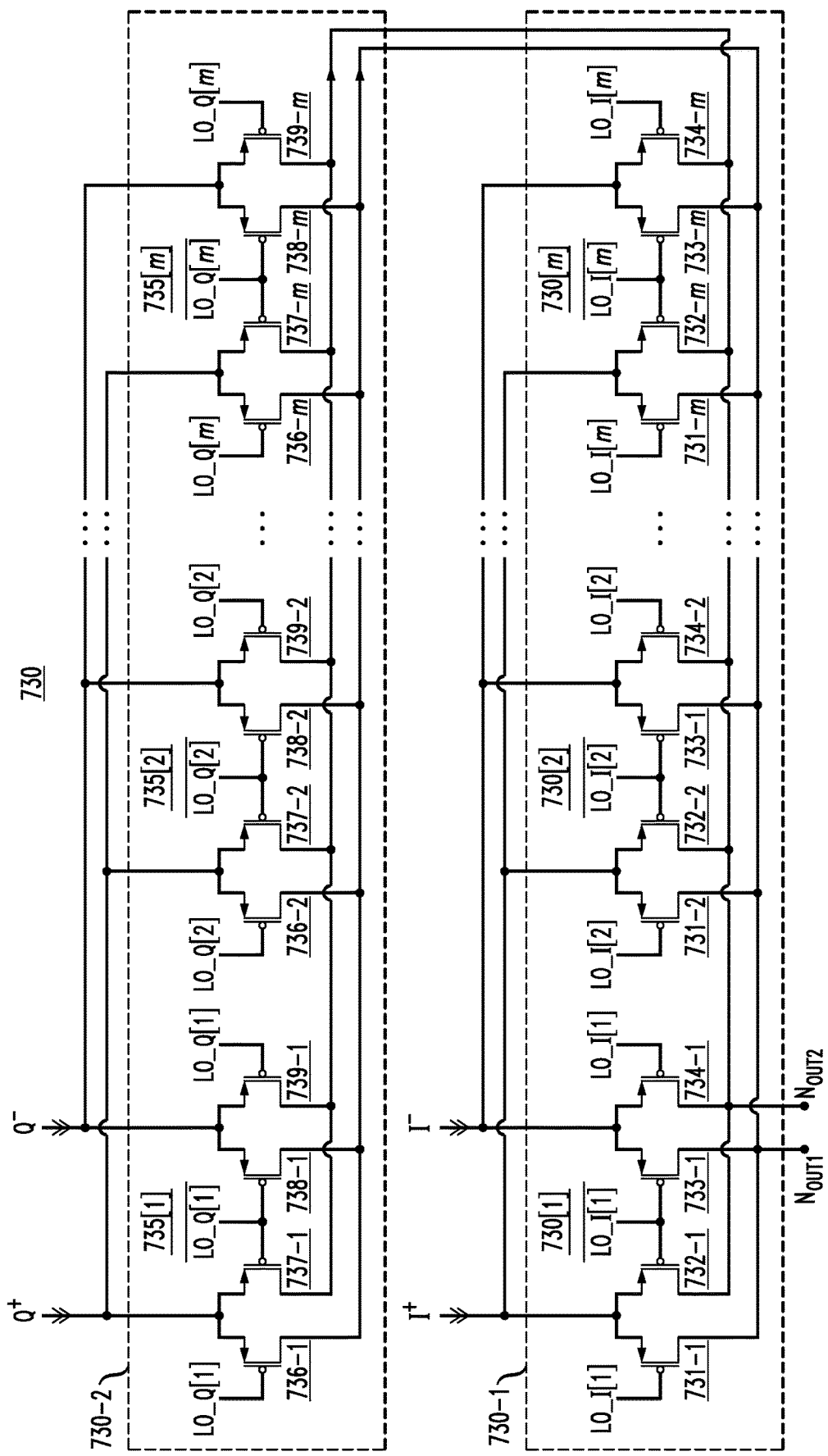

FIGS. 7A and 7B schematically illustrate an RF signal generator system according to another exemplary embodiment of the invention, which comprises a current-mode RF output stack that is configured to operate at a reduced power supply voltage. In particular, FIGS. 7A and 7B schematically illustrate an RF signal generator system 700 which is based on the architecture of the RF signal generator system 600 of FIG. 6, but where FIGS. 7A and 7B illustrate details of exemplary circuit implementations of a current-commutating mixer stage 730, an attenuation stage 740, and a replica bias circuit 774. Similar to the exemplary embodiment of FIG. 6, the RF signal generator system 700 comprises an RF output stage architecture in which the current-commutating mixer stage 730 and the attenuation stage 740 are placed at the same level of the output stack to eliminate one level of stacking in the RF output stage to improve headroom and allow the use of a lower supply voltage VDD.

The current-commutating mixer stage 730 comprises a differential I mixer 730-1 and a differential Q mixer 730-2. The differential I mixer 730-1 comprises a plurality of mixer quad segments 730-1 [1:m] (e.g., m mixer quad segments), wherein each of the m mixer quad segments 730-1[1:m] comprises a corresponding instance of a first transistor 731[1:m], a second transistor 732[1:m], a third transistor 733 [1:m], and a fourth transistor 734[1:m]. The differential Q mixer 730-2 comprises a similar array of mixer quad segments. For example, FIG. 7B schematically illustrates an exemplary layout of the differential I mixer 730-1 and the differential Q mixer 730-2, each having an array of mixer quad segments, according to an exemplary embodiment of the disclosure.

As shown in FIG. 7B, the differential I mixer 730-1 comprises m mixer quad segments 730[1], 730[2], . . . , 730[$m$]. The first mixer quad segment 730[1] comprises four mixer transistors 731-1, 732-1, 733-1, and 734-1. The second mixer quad segment 730[2] comprises four mixer transistors 731-2, 732-2, 733-2, and 734-2. The $m^{th}$ mixer quad segment 730[$m$] comprises four mixer transistors 731-$m$, 732-$m$, 733-$m$, and 734-$m$. Each mixer quad segment 730[1], 730[2], . . . , 730[$m$] is coupled to the baseband current signal output nodes I$^+$ and I$^-$ of the baseband signal input stage 620, and coupled to the output nodes N$_{OUT1}$ and N$_{OUT2}$ of the current-commutating mixer stage 730, as shown.

Similarly, the differential Q mixer 730-2 comprises m mixer quad segments 735[1], 735[2], . . . , 735[$m$]. The first mixer quad segment 735[1] comprises four mixer transistors 736-1, 737-1, 738-1, and 739-1. The second mixer quad segment 735[2] comprises four mixer transistors 736-2, 737-2, 738-2, and 739-2. The $m^{th}$ mixer quad segment 735[$m$] comprises four mixer transistors 736-$m$, 737-$m$, 738-$m$, and 739-$m$. Each mixer quad segment 735[1], 735 [2], . . . , 735[$m$] is coupled to the baseband current signal output nodes Q$^+$ and Q" of the baseband signal input stage 620, and coupled to the output nodes N$_{OUT1}$ and N$_{OUT2}$ of the current-commutating mixer stage 730, as shown.

As further shown in FIG. 7B, in the differential I mixer 730-1, the mixer quad segment 730[1] comprises inputs that receive the LO signals LO_I[1] and $\overline{\text{LO\_I[1]}}$, the mixer quad segment 730[2] comprises inputs that receive the LO signals LO_I[2] and $\overline{\text{LO\_I[2]}}$, and the mixer quad segment 730[$m$] comprises inputs that receive the LO signals LO_I[m] and $\overline{\text{LO\_I[m]}}$. Similarly, in the differential Q mixer 730-2, the mixer quad segment 735[1] comprises inputs that receive the LO signals LO_Q[1] and $\overline{\text{LO\_Q[1]}}$, the mixer quad segment 735[2] comprises inputs that receive the LO signals LO_Q [2] and $\overline{\text{LO\_Q[2]}}$, and the mixer quad segment 735[$m$] comprises inputs that receive the LO signals LO_Q[m] and $\overline{\text{LO\_Q[m]}}$.

As noted above, the LO signal output driver circuitry 680 (FIG. 6) is configured to generate the LO switching signals and/or DC LO voltages which drive the complementary inputs {LO_I[1], $\overline{\text{LO\_I[1]}}$}, {LO_I[2], $\overline{\text{LO\_I[2]}}$}, . . . {LO_I [m], LO_I[m] } of the respective mixer quad segments 730[1], 730[2], . . . , 730[$m$] of the differential I mixer 730-1, and which drive the complementary inputs {LO_Q[1], $\overline{\text{LO\_Q[1]}}$}, {LO_Q[2], $\overline{\text{LO\_Q[2]}}$}, . . . {LO_Q[m], $\overline{\text{LO\_Q[m]}}$} of the respective mixer quad segments 735[1], 735[2], . . . , 735[$m$] of the differential Q mixer 730-2. To implement attenuation functions, as noted above, one or more of the mixer quad segments in the differential I-mixer 730-1 and the differential Q mixer 730-2 can be disabled by applying DC LO voltages of logic "1" level (logic High) to the inputs of the given mixer quad segments. For example, to disable the first mixer quad segments 730[1] and 735[1] in the differential I and Q mixers 730-1 and 730-2, the LO signal output driver circuitry 680 (FIG. 6) would (i) drive the complementary inputs {LO_I[1], $\overline{\text{LO\_I[1]}}$} of the first mixer quad segment 730[1] with DC logic High/High, to turn off the four mixer transistors 731-1, 732-1, 733-1, and 734-1, and (ii) drive the complementary inputs {LO_Q[1], $\overline{\text{LO\_Q[1]}}$} of the first mixer quad segment 735[1] with DC logic High/High, to turn off the four mixer transistors 736-1, 737-1, 738-1, and 739-1.

Referring back to FIG. 7A, the attenuation stage 740 comprises a first array of attenuation segments 740-1, and a second array of attenuation segments 740-2. The first array of attenuation segments 740-1 comprises a plurality of attenuation segments 740[1], . . . , 740[$n$], where each attenuation segment comprises a pair of shunting transistors. In particular, the first attenuation segment 740[1] comprises first and second shunting transistors 741-1 and 742-1, and the n$^{th}$ attenuation segment 740[$n$] comprises first and second shunting transistors 741-$n$ and 742-$n$. The first shunting transistors 741-1, . . . , 741-$n$ (collectively, first shunting transistors 741) have source terminals that are coupled to the baseband current signal output node t of the baseband signal input stage 620, and drain terminals that are coupled to the negative power supply node VSS. The second shunting transistors 742-1, . . . , 742-$n$ (collectively, second shunting transistors 742) have source terminals that are coupled to the baseband current signal output node I$^-$ of the baseband signal input stage 620, and drain terminals that are coupled to the negative power supply node VSS. In addition, the first and second shunting transistors 741 and 742 in all attenuation segments 740[1], . . . , 740[$n$] have gate terminals that are selectively coupled to the positive power supply node through respective switches S1, and selectively coupled to the negative power supply node through respective switches S2.

The attenuation stage 740 is controlled by the complementary control signals ATTN[1: n] and $\overline{\text{ATTN[1:n]}}$, which are applied to both the first array of attenuation segments 740-1, and to the second array of attenuation segments 740-2. As schematically illustrated in FIG. 7A, the first set of switches S1 of the attenuation segments 740[1], . . . , 740[$n$] are controlled by respective control signals $\overline{\text{ATTN[1]}}$, . . . , $\overline{\text{ATTN[n]}}$, and the second set of switches S2 of the attenuation segments 740[1], . . . , 740[$n$] are controlled by respective control signals ATTN[1], . . . , ATTN[n]. In the exemplary configuration, all attenuation segments 740[1], . . . , 740[$n$] can be disabled by selectively activating all the switches S1 (via control signals $\overline{\text{ATTN[1]}}$, . . . $\overline{\text{ATTN[n]}}$) to connect the gate terminals of the first and second shunting transistors 741 and 742 in all attenuation segments 740[1], . . . , 740[$n$] to the positive power supply node and, and thereby, turn off the first and second shunting transistors 741 and 742.

On the other hand, to implement an attenuation function, a given attenuation segment can be selectively enabled by deactivating the switches S1 and activating the switches S2 that are coupled to the gate terminals of the first and second shunt transistors 741 and 742 of the given attenuation segment. For example, to activate the first attenuation segment 740[1], the control signal ATTN[1] would be asserted to "close" the switches S2 coupled to the gate terminals of the first and second shunt transistors 741-1 and 742-1, and the complementary signal $\overline{\text{ATTN[1]}}$ would be de-asserted to "open" the switches S1 coupled to the gate terminals of the first and second shunt transistors 741-1 and 742-1. In this configuration, the gate terminals of the first and second shunting transistors 741-1 and 742-1 are coupled to ground (VSS), which turns on the first and second shunting transistors 741-1 and 742-1. When enabled, the first attenuation segment 740[1] shunts a portion of the baseband signal current I$^+$ and I$^-$ to ground.

While FIG. 7A does not specifically illustrate the second array of attenuation segments 740-2, it is to be noted that the second array of attenuation segments 740-2 has the same configuration as the first array of attenuation segments 740-1, except that the first and second shunting transistors in the second array of attenuation segments 740-2 would have source terminals coupled to the respective baseband current signal output nodes Q$^+$ and Q. The first and second array of attenuation segments 740-1 and 740-2 have the same number n of attenuation segments, and in operation, the first and second array of attenuation segments 740-1 and 740-2 would have the same amount of attenuation segments that were enabled and disabled at a given time, to ensure that the same amount of attenuation is equally applied to the I and Q phases (and thereby prevent imbalance of the I and Q signals).

The replica bias circuit 774 shown in FIG. 7A is similar to the replica bias circuits discussed above in that the replica bias circuit 774 comprises (i) a replica current source 780 (e.g., current mirror) that is configured to generate a bias current of magnitude $\alpha*I_2$ (where $I_2$ denotes the desired bias current of the current-mode RF output stage of FIG. 7A), (ii) a replica transistor 782 which corresponds to an input transistor of the baseband signal input stage 620, and (iii) a baseband filter replica circuit 784 which comprises replica devices and a replica topology that correspond to the devices and the type of single-ended voltage-mode baseband filter circuits utilized in the voltage-mode baseband filter stage 610.

The replica bias circuit 774 further comprises an array of replica transistors 786[1:m] which correspond to the mixer transistors in the array of mixer quad segments of the differential I and Q mixers 730-1 and 730-2. In addition, the replica bias circuit 774 comprises an array of replica transistors 788[1:n] which correspond to the shunt transistors of the attenuation segments in the first and second arrays of attenuation segments 740-1 and 740-2. The array of replica transistors 786[1:m] for the mixer transistors are controlled by respective voltages V1[1:m]. The array of replica transistors 788[1:n] for the shunt transistors are controlled by respective voltages V2[1:n]. In the replica bias circuit, the assertion of the control voltages V1[1:m] and V2[1:n] is coordinated with the control signals that activate/deactivate the mixer quad segments and attenuation segments such that the total number of conducting (enabled) transistors in the array of replica transistors 786[1:m] and in the array of replica transistors 788[1:n] match the corresponding number of conducting (enabled) mixer quad segments and attenuation segments in the main functional circuit. In addition, as with the other replica bias circuits discussed above, the output amplitude can be changed by coarse control of a segmented driver stage and/or using a fine control of current into the replica circuit.

Figure 8:
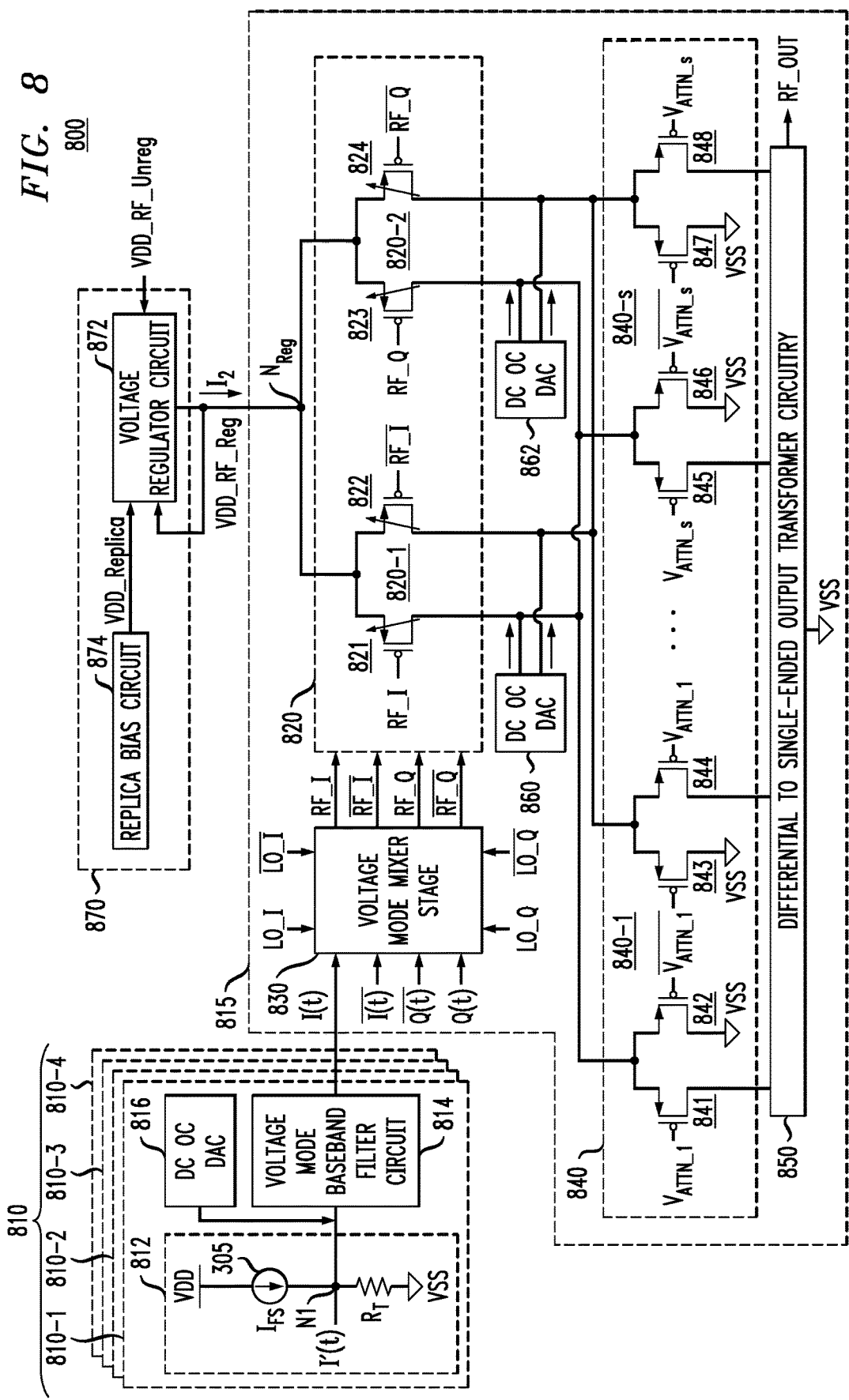
FIG. 8 schematically illustrates a radio frequency signal generator system, according to another exemplary embodiment of the disclosure.

Next, FIG. 8 schematically illustrates an RF signal generator system 800 according to another exemplary embodiment of the invention, which comprises an RF output stack that is configured to operate at a reduced power supply voltage. More specifically, the RF signal generator system 800 comprises a voltage-mode baseband filter stage 810, and an RF output stage 815 which comprises an RF signal input stage 820, a voltage-mode mixer stage 830, an attenuation stage 840, an output transformer stage 850, a first DC offset compensation DAC 860, and a second DC offset compensation DAC 862. The RF signal generator system 800 further comprises a regulation system 870 which comprises a voltage regulator circuit 872, and a replica bias circuit 874.

The RF signal generator system 800 is similar to the exemplary embodiments as discussed above, except that the voltage-mode mixer stage 830 is placed between the voltage-mode baseband filter stage 810 and RF signal input stage 820. The voltage-mode baseband filter stage 810 comprises a plurality of single-ended voltage-mode baseband filter circuits 810-1, 810-2, 810-3, and 810-4 which output respective filtered baseband voltage signals I(t), $\overline{\text{I(t)}}$, Q(t), and $\overline{\text{Q(t)}}$. The voltage-mode mixer stage 830 is configured to receive the filtered baseband voltage signals I(t), $\overline{\text{I(t)}}$, Q(t), and $\overline{\text{Q(t)}}$ and the complementary quadrature LO signals LO_I, $\overline{\text{LO\_I}}$, LO_Q, and $\overline{\text{LO\_Q}}$, and perform mixing operations using voltage-mode differential I and Q mixers to thereby generate and output complementary in-phase RF signals, RF_I and $\overline{\text{RF\_I}}$, and complementary quadrature-phase RF signals RF_Q and $\overline{\text{RF\_Q}}$.

The RF signal input stage 820 comprises a first differential transistor pair 820-1 which comprises input transistors 821 and 822 having gate terminals that receive the in-phase RF signals RF_I and $\overline{\text{RF\_I}}$, respectively. The RF signal input stage 820 comprises a second differential transistor pair 820-2 which comprises input transistors 823 and 824 having gate terminals that receive the quadrature-phase RF signals RF_Q and $\overline{\text{RF\_Q}}$, respectively. The RF signal input stage 820 generates RF current signals that are applied to the attenuation stage 840. The attenuation stage 840 and output transformer stage 850 perform functions similar to the attenuation stage 240 and output transformer stage 250 as discussed above in conjunction with FIG. 2B. The exemplary RF output stage 815 is configured to operate at a lower VDD_RF supply voltage by placing the voltage mode mixer stage 830 and the RF signal input stage 820 at the same level in the stack structure of the RF output stage 815, which effectively eliminates one level of transistor stacking in the RF output stage 815 to provide additional headroom for utilizing a lower VDD supply voltage.

The voltage-mode baseband filter stage 810 comprises a plurality of single-ended voltage-mode baseband filter circuits 810-1, 810-2, 810-3, and 810-4, which can be implemented using any of the exemplary baseband filter circuits as shown, for example, in FIGS. 3A-3F. For example, as shown in FIG. 8, the voltage-mode baseband filter circuit 810-1 comprises an input stage 812 and voltage-mode baseband filter circuit 814, which operate in the same or similar manner as the same elements shown in FIGS. 3A-3F.

In addition, voltage-mode baseband filter circuit 810-1 comprises a DC offset compensation DAC 816 which is configured to inject DC compensation current to the input node N1 to correct for DC offsets, in conjunction with the DC offset compensation DACs 860 and 862. As noted above, a DC offset results from a static asymmetry between the differential current signals I$^+$ and I$^-$, and the differential current signals Q$^+$, and Q$^-$. In the exemplary embodiment of FIG. 8, DC offset cancellation is performed at different points (e.g., two different points) in the circuit architecture, which helps in terms of range and resolution of the offset voltage to be cancelled. The DC offset compensation is configured to minimize offset between the I$^+$ and I$^-$ channels, and to minimize the offset between the Q$^+$ and Q$^-$ channels, so that the spectrum leakage at the LO frequency (e.g., output signal at LO frequency) is minimized.

The regulation system 870 operates in the same or similar manner as the regulation systems shown in e.g., FIGS. 4, 6, and 7A. For example, in some embodiments, the replica bias circuit 874 could be implemented using a replica bias circuit architecture such as shown in FIG. 4 or FIG. 5B, but without the replica mixer transistor 434.

Figure 9:
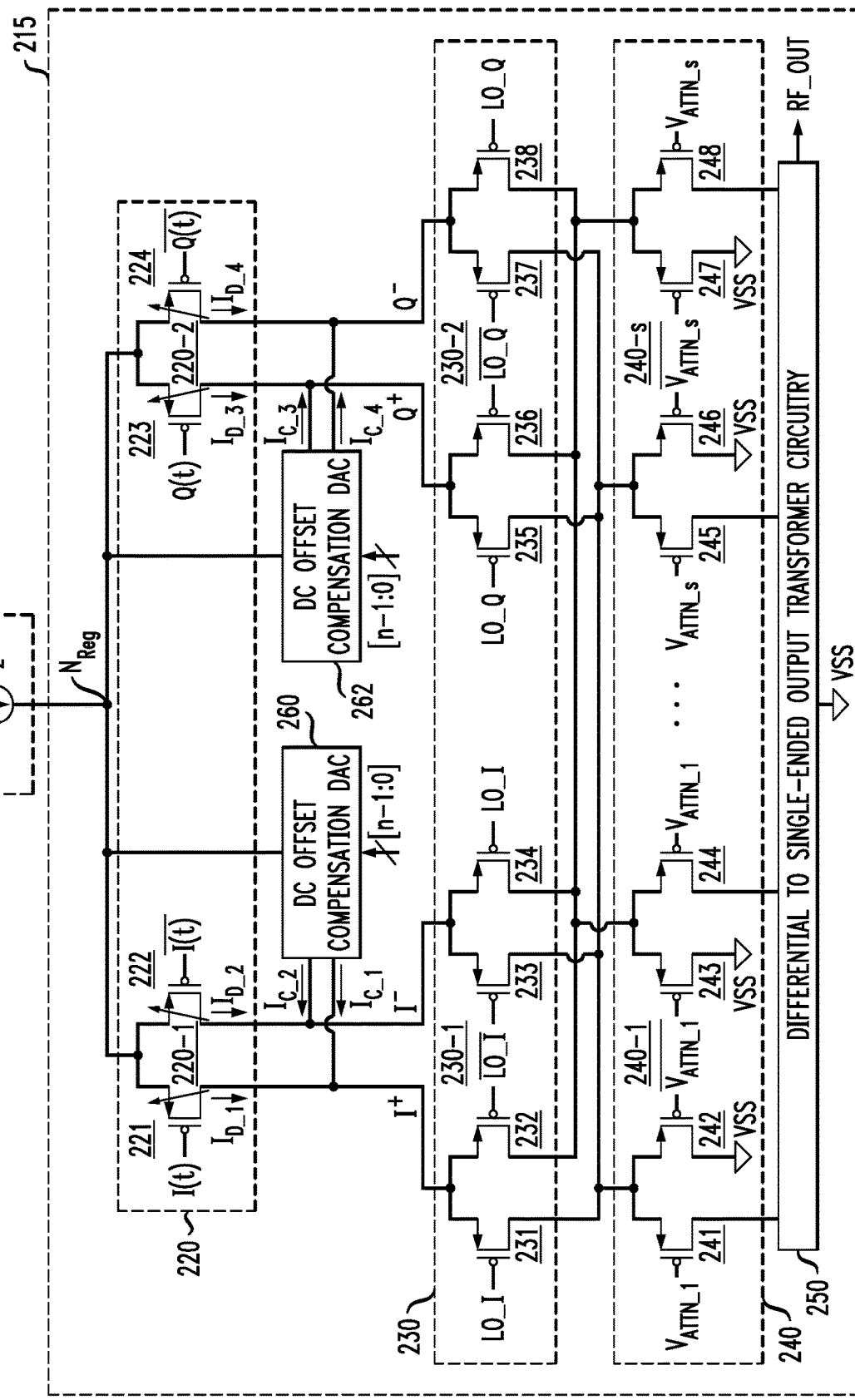
FIG. 9 schematically illustrates a radio frequency signal generator system, according to another exemplary embodiment of the disclosure.

Next, FIG. 9 schematically illustrates an RF signal generator system 900 according to another exemplary embodiment of the invention. The RF signal generator system 900 comprises an architecture that is similar to the RF signal generator system 200 shown in FIGS. 2A and 2B, except that the RF signal generator system 900 comprises a regulation system 910 which is based on current regulation instead of voltage regulation. Specifically, the regulation system 910 comprises a current source 912 (e.g., current mirror 912) that is coupled between the positive power supply node VDD and the regulated node $N_{Reg}$ and configured to adjust a voltage level on the regulated node $N_{Reg}$ to which the source nodes of the baseband input transistors 221, 222, 223, and 224 are commonly connected. In this regard, the current source 912 is utilized to generate a fixed current I$_2$ which is injected into the regulated node $N_{Reg}$ for biasing the current-mode RF output stage 215, as opposed to utilizing an LDO voltage regulator and replica bias circuit, as in the exemplary embodiments discussed above.

In some embodiments, the RF signal generator system 900 comprises a voltage-mode baseband filter stage (such as shown in FIG. 2A) which can be implemented, for example, using any one of the single-ended voltage-mode baseband filter circuits as shown in FIGS. 3A-3F, in which the voltage-mode baseband filter circuits have output terminals coupled to respective gate terminals of the input transistors 221, 222, 223, and 224 of the baseband input stage 220. In operation, despite variations in the VDD supply voltage, the current source 912 generates a fixed quiescent current, which forces the DC $V_{GS}$ bias voltages of the baseband input transistors 221, 222, 223, and 224 to be at the proper level so that each of the respective baseband input transistors 221, 222, 223, and 224 conducts a current corresponding to its share of the fixed quiescent current I$_2$. For example, if the voltage on the regulated node $N_{Reg}$ is too low, then the total current flowing through the baseband input transistors 221, 222, 223, and 224 would be less than I2, which would naturally cause the voltage on the regulated node $N_{Reg}$ to increase until the total current flowing through the baseband input transistors 221, 222, 223, and 224 matches the fixed quiescent current I$_2$ generated by the current source 912. As a result, the DC $V_{GS}$ bias voltages of the respective baseband input transistors 221, 222, 223, and 224 would settle to the proper $V_{GS}$ values to generate the proper quiescent currents in total to match the fixed quiescent current I$_2$.

It is to be appreciated that the exemplary radio frequency signal generation systems as described herein are configured to operate at relatively low power supply voltage and low power consumption (e.g., milliwatt range), which allows the radio frequency signal generation systems to be implemented with cryo-electronics that are used for quantum computing applications and other applications or systems which operate at cryogenic temperatures. For example, in the context of quantum computing systems which implement superconducting qubits and other components, the exemplary radio frequency signal generation systems as discussed herein can be implemented as an AWG system that is configured to generate RF control pulses to control superconducting qubits to perform high-fidelity qubit gate operations (e.g., single-qubit gate operations, entanglement gate operations, etc.).

Figure 10:
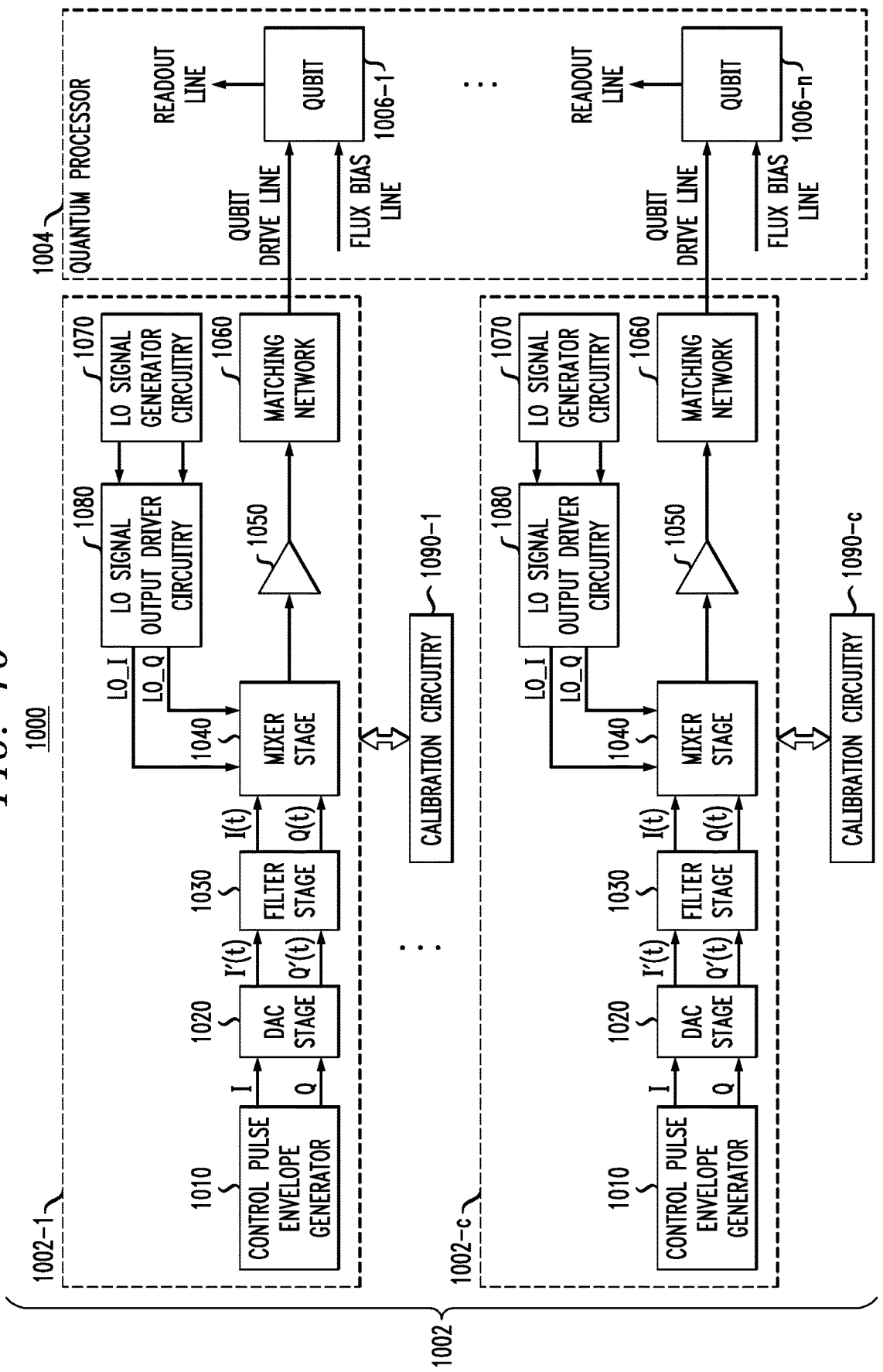
FIG. 10 schematically illustrates a quantum computing system which implements an arbitrary waveform generator system and calibration circuitry, according to an exemplary embodiment of the disclosure.

For example, FIG. 10 schematically illustrates a quantum computing system 1000 which implements an arbitrary waveform generator system and calibration circuitry, according to an exemplary embodiment of the disclosure. The quantum computing system 1000 comprises an arbitrary waveform generator system 1002 (or AWG system 1002) and a quantum processor 1004. The quantum processor 1004 comprises a plurality (n) of superconducting qubits 1006-1, . . . , 1006-n. The superconducting qubits 1006-1, . . . , 1006-n may comprise superconducting transmon qubits, superconducting fluxonium qubits, superconducting multi-mode qubits, and other types, or combinations of different types, of superconducting qubits, which are suitable for a given application. Further, in some embodiments, the quantum processor 1004 comprises coupler circuits (e.g., passive coupler circuits and/or active coupler circuits), wherein a given coupler circuit is configured to couple a pair of superconducting qubits to implement entanglement gate operations (e.g., two-qubit gate operations).

The quantum processor 1004 further comprises a plurality of control lines (e.g., transmission line resonators) including, but not limited to, qubit drive lines, flux bias lines, state readout lines, and active coupler drive lines, etc. In some embodiments, the qubit drive lines are coupled (e.g., capacitively coupled) to respective ones of the superconducting qubits 1006-1, . . . 1006-n. The qubit drive lines are configured to apply control pulses (which are generated by the AWG system 1002) to the respective superconducting qubits 1006-1, . . . , 1006-n to independently change the states of the respective superconducting qubits (e.g., single-qubit gate operations), e.g., change the state of given superconducting qubit to be in, e.g., a ground state 10), an excited state 11), or a superposition state. As is known in the art, the state of a superconducting qubit can be changed by applying a microwave control pulse with a center frequency that is equal to a transition frequency (denoted $f_{01}$) of the qubit, wherein the transition frequency $f_{01}$ corresponds to an energy difference between the ground state |0) and excited state |1) of the qubit. In some embodiments, the superconducting qubits 1006-1, . . . , 1006-n are configured to have different operating frequencies (transition frequencies) so that the transition frequencies of neighboring qubits are detuned.

The state readout lines are coupled to respective ones of the superconducting qubits 1006-1, . . . , 1006-n to read the states of the superconducting qubits using known techniques (e.g., dispersive readout). In embodiments where the superconducting qubits comprise frequency-tunable qubits (e.g., flux-tunable transmon qubits or fluxonium qubits, etc.), the flux bias control lines would be coupled (e.g., inductively coupled) to respective superconducting qubits to apply flux bias control signals to tuning structures of the superconducting qubits to tune the operating frequencies of the tunable qubits, as needed for a given application. In addition, for active coupler circuits, coupler drive lines would be coupled (e.g., capacitively coupled) to respective coupler circuits, wherein each coupler circuit would have an operating frequency or transition frequency. A given coupler circuit would be driven by a control pulse generated by the AWG system 1002, or some other pulse signal generator, to enable exchange coupling between superconducting qubits that are coupled through the given coupler circuit and implement a two-qubit gate operation.

As shown in FIG. 10, the AWG system 1002 comprises a multi-channel AWG framework which comprises a plurality of AWG channels 1002-1, . . . , 1002-c. The AWG channels 1002-1, . . . , 1002-c are configured to generate control pulses that are applied on the qubit drive lines to control respective ones of the superconducting qubits 1006-1, . . . , 1006-n. Although not specifically shown in FIG. 10, in some embodiments, the AWG system 1002 would include AWG channels to generate control signals that are applied to the coupler drive lines to control active coupler devices of the quantum processor 1004.

The AWG channels 1002-1, . . . , 1002-c each comprise a respective control pulse envelope generator 1010, a DAC stage 1020, a filter stage 1030, an I/Q mixer stage 1040, an amplifier/attenuator stage 1050, a matching network 1060, an LO signal generator circuit 1070, and an LO signal output driver circuit 1080. The control pulse envelope generators 1010 are configured to implement pulse-shaping techniques to generate RF control pulses with desired control pulse envelope shapes (e.g., Gaussian pulses, cosine pulses (e.g., sum of half cosines), hyperbolic secant pulses, etc.), which are applied to superconducting qubits or active qubit coupler circuits to perform single qubit gate operations, entanglement gate operations, etc. The shaped control pulses are calibrated to drive $f_{01}$ transitions of the qubits, while suppressing $f_{12}$ and higher transitions. Essentially, such pulse shaping techniques suppress/reduce the transients associated with turning the control pulses on and off. In addition, pulse-shaping techniques include DRAG (derivative removal by adiabatic gate) correction pulses, which can be used in conjunction with shaped pulses (such as Gaussian pulses, cosine pulses, or hyperbolic secant pulses) to further suppress unwanted state transitions, while maintaining a same pulse envelope area (or integral of pulse envelope).

In each AWG channel of the AWG system 1002, the digital control pulse envelope signals (digital I and Q components) are converted to analog control pulse envelope signals (analog baseband I/Q signals), and the I/Q mixer stage 1040 modulates the quadrature LO signals using the baseband I/Q signals by performing, e.g., SSB modulation, as discussed above, to generate a modulated signal in the form of an RF control pulse that is applied, e.g., on a qubit drive line to control a given qubit. The functions of the various stages 1020, 1030, 1050, 1060, 1070, and 1080 are the same or similar to the corresponding stages in FIG. 1, FIG. 2, etc., the details of which will not be repeated.

As further shown in FIG. 10, in some embodiments, each AWG channel 1002-1, . . . , 1002-c of the AWG system 1002 comprises dedicated calibration circuitry 1090-1, . . . , 1090-c, which is implemented on-chip with the AWG system 1002. The calibration circuitry 1090-1, . . . , 1090-c is configured to calibrate the respective AWG channels 1002-1, . . . , 1002-c of the AWG system 1002 for different operating modes, as discussed above. The calibration circuitry 1090-1, . . . , 1090-c comprises the hardware control and logic circuitry (e.g., DC offset compensation DACs, control logic circuitry to generate control signals, etc.) as discussed above. In some embodiments, the calibration circuitry 1090-1, . . . , 1090-c is controlled by software running on a computing platform that controls the quantum computing system 1000.

Figure 11:
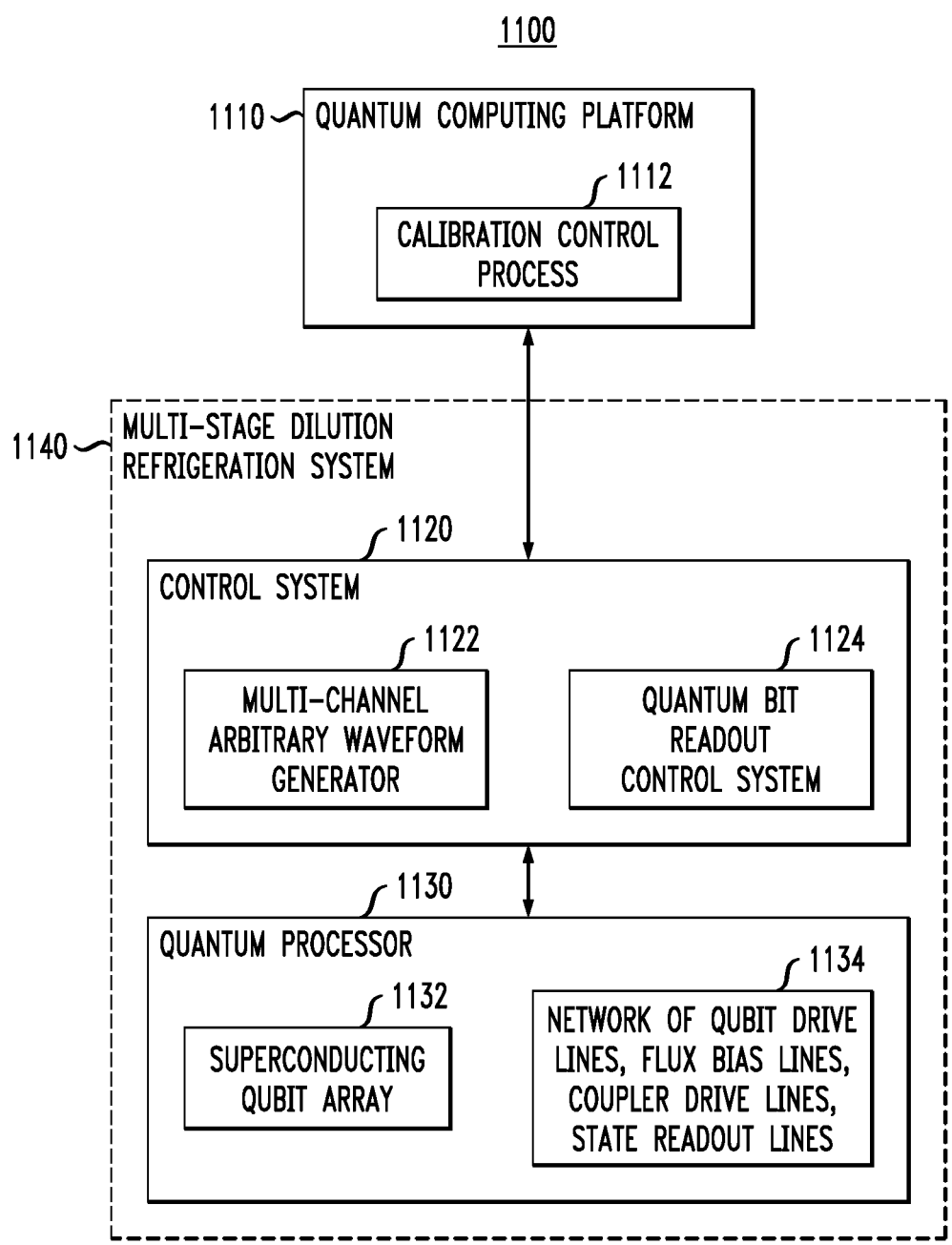
FIG. 11 schematically illustrates a quantum computing system, according to another exemplary embodiment of the disclosure.

For example, FIG. 11 schematically illustrates a quantum computing system, according to another exemplary embodiment of the disclosure. In particular, FIG. 11 schematically illustrates a quantum computing system 1100 which comprises a quantum computing platform 1110, a control system 1120, and a quantum processor 1130. In some embodiments, the quantum computing platform 1110 implements software control programs such as a calibration control process 1112 which performs functions such as configuring the AWG system, controlling the execution of high-level functions of the calibration processes, etc.

Furthermore, the quantum computing platform 1110 executes calibration procedures that are periodically performed on a quantum system such as a quantum processor to calibrate various quantum elements such as readout resonators, data qubits, and coupler circuitry, etc., to enable high-fidelity gate operations (e.g., single-qubit gate operations and entanglement gate operations). For example, various types of in-situ calibration procedures are periodically performed to, e.g., determine the resonant frequencies of readout resonators, determine the transition frequencies of qubits, determine coherence times ($T_1$) of the qubits (where the coherence time $T_1$ of a given qubit denotes the time it takes for the qubit state to decay from the excited state to the ground state), determine transverse relaxation times ($T_2$) of the qubits (or dephasing time), calibrate control pulses that are applied to qubits to perform single-qubit gate operations, calibrate control pulses that are applied to active coupler circuits to perform entanglement gate operations, etc. The calibration procedures result in determining various control parameters that are maintained in a calibration database and periodically updated on the order of seconds, minutes, hours, days, etc., as needed, depending on the type of quantum element and the operating characteristics of the quantum computing system, and other factors as is understood by those of ordinary skill in the art.

In some embodiments, the control system 1120 comprises a multi-channel arbitrary waveform generator 1122, and a quantum bit readout control system 1124 (wherein FIG. 10 schematically illustrates an exemplary AWG system 1002 which can be implanted in the control system 1120). The quantum processor 1130 comprises a solid-state semiconductor chip having a superconducting qubit array 1132 and a network 1134 of qubit drive lines, coupler drive lines, and qubit state readout lines, and other circuit QED components that may be needed for a given application or quantum system configuration.

In some embodiments, the control system 1120 and the quantum processor 1130 are disposed in a dilution refrigeration system 1140 which can generate cryogenic temperatures that are sufficient to operate components of the control system 1120 for quantum computing applications. For example, the quantum processor 1130 may need to be cooled down to near-absolute zero, e.g., 10-15 millikelvin (mK), to allow the superconducting qubits to exhibit quantum behaviors. In some embodiments, the dilution refrigeration system 1140 comprises a multi-stage dilution refrigerator where the components of the control system 1120 can be maintained at different cryogenic temperatures, as needed. For example, while the quantum processor 1130 may need to be cooled down to, e.g., 10-15 mK, the circuit components of the control system 1120 may be operated at cryogenic temperatures greater than 10-15 mK (e.g., cryogenic temperatures in a range of 3K-4K), depending on the configuration of the quantum computing system.

In some embodiments, the superconducting qubit array 1132 comprises a plurality of superconducting transmon qubits and superconducting tunable coupler qubits, in which each pair of superconducting qubits is connected by a respective superconducting qubit coupler, using techniques as discussed herein. The network 1134 of qubit drive lines, flux bias lines, coupler drive lines, and qubit state readout lines, etc., are configured to apply microwave control signals to superconducting qubits and coupler circuitry in the superconducting qubit array 1132 to perform various types of gate operations, e.g., single-gate operations, entanglement gate operations, etc., as well as read the quantum states of the superconducting qubits. The network 1134 of qubit drive lines, flux bias lines, coupler drive lines, and qubit state readout lines, etc., is coupled to the control system 1120 through a suitable hardware input/output (I/O) interface, which couples I/O signals between the control system 1120 and the quantum processor 1130. For example, the hardware I/O interface may comprise various types of hardware and components, such as RF cables, wiring, RF elements, optical fibers, heat exchanges, filters, amplifiers, isolators, etc.

Figure 12:
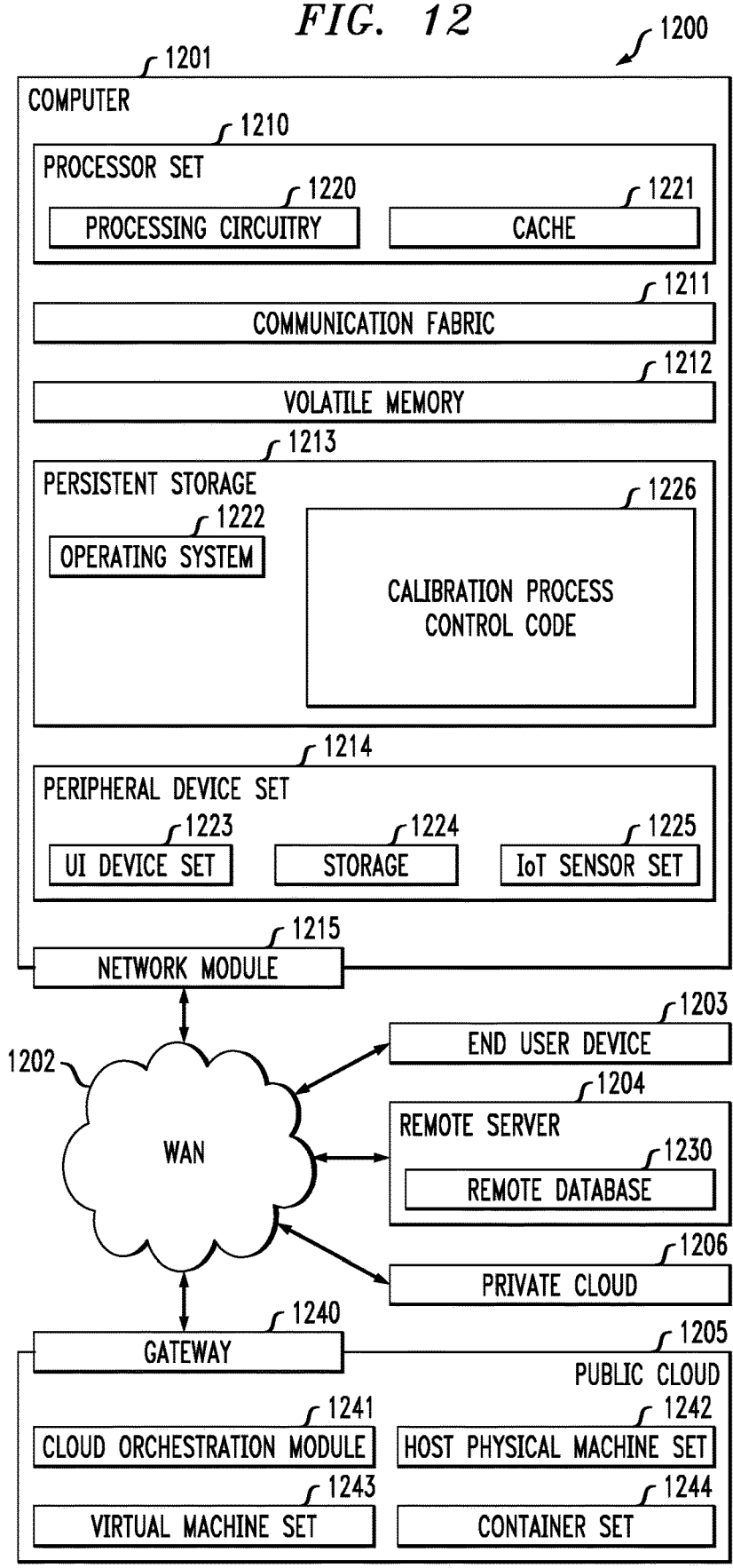
FIG. 12 schematically illustrates an exemplary computing environment which is configured to execute program instructions for controlling calibration processes of a calibration system, according to an exemplary embodiment of the disclosure.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application. In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1200 contains an example of an environment for the execution of at least some of the computer code involved in performing the inventive methods, such as calibration process control code 1226 for controlling functions of, e.g., the calibration control system 190 of FIG. 1, and the calibration circuitry 1090-1, ..., 1090-c of FIG. 19, etc. In addition to block 1226, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1226, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

Computer 1201 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method may be distributed among multiple computers and/or between multiple locations. On the other hand, in this presentation of computing environment 1200, detailed discussion is focused on a single computer, specifically computer 1201, to keep the presentation as simple as possible. Computer 1201 may be located in a cloud, even though it is not shown in a cloud in FIG. 12. On the other hand, computer 1201 is not required to be in a cloud except to any extent as may be affirmatively indicated.

Processor set 1210 includes one, or more, computer processors of any type now known or to be developed in the future. Processing circuitry 1220 may be distributed over multiple packages, for example, multiple, coordinated integrated circuit chips. Processing circuitry 1220 may implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set may be located "off chip." In some computing environments, processor set 1210 may be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods may be stored in block 1226 in persistent storage 1213.

Communication fabric 1211 is the signal conduction paths that allow the various components of computer 1201 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory may be distributed over multiple packages and/or located externally with respect to computer 1201.

Persistent storage 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 may be a read only memory (ROM), but typically at least a portion of the persistent storage allows writing of data, deletion of data and re-writing of data. Some familiar forms of persistent storage include magnetic disks and solid-state storage devices. Operating system 1222 may take several forms, such as various known proprietary operating systems or open source Portable Operating System Interface type operating systems that employ a kernel. The code included in block 1226 typically includes at least some of the computer code involved in performing the inventive methods.

Peripheral device set 1214 includes the set of peripheral devices of computer 1201. Data communication connections between the peripheral devices and the other components of computer 1201 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 may include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 may be persistent and/or volatile. In some embodiments, storage 1224 may take the form of a quantum computing storage device for storing data in the form of qubits. In embodiments where computer 1201 is required to have a large amount of storage (for example, where computer 1201 locally stores and manages a large database) then this storage may be provided by peripheral storage devices designed for storing very large amounts of data, such as a storage area network (SAN) that is shared by multiple, geographically distributed computers. IoT sensor set 1225 is made up of sensors that can be used in Internet of Things applications. For example, one sensor may be a thermometer and another sensor may be a motion detector.

Network module 1215 is the collection of computer software, hardware, and firmware that allows computer 1201 to communicate with other computers through WAN 1202. Network module 1215 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1203 is any computer system that is used and controlled by an end user (for example, a customer of an enterprise that operates computer 1201), and may take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 may be a client device, such as thin client, heavy client, mainframe computer, desktop computer and so on.

Remote server 1204 is any computer system that serves at least some data and/or functionality to computer 1201. Remote server 1204 may be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data may be provided to computer 1201 from remote database 1230 of remote server 1204.

Public cloud 1205 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs may be stored as images and may be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware, and firmware that allows public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1206 is similar to public cloud 1205, except that the computing resources are only available for use by a single enterprise. While private cloud 1206 is depicted as being in communication with WAN 1202, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a voltage-mode filter circuit which is configured to generate a voltage signal on an output terminal thereof;
    a current-mode output circuit comprising an input transistor which comprises a gate terminal coupled to the output terminal of the voltage-mode filter circuit, and a source terminal coupled to a regulated node; and
    a regulation circuit configured to adjust a voltage level on the regulated node to maintain a constant gate-source bias voltage for the input transistor to generate a current for biasing the current-mode output circuit.

2. The device of claim 1, wherein the voltage-mode filter circuit and the current-mode output circuit comprise an analog signal processing path of a radio frequency signal generator.

3. The device of claim 1, wherein the voltage-mode filter circuit comprises an analog Sallen-Key filter circuit that is based on a unity gain source follower.

4. The device of claim 1, wherein the regulation circuit comprises:
    a low-dropout voltage regulator circuit which is configured to receive as input an unregulated power supply voltage and a reference voltage, and generate a regulated power supply voltage on the regulated node, which corresponds to the reference voltage; and a replica bias circuit which is configured to generate the reference voltage based on replica devices and topologies of the voltage-mode filter circuit and the current-mode output circuit.

5. The device of claim 1, wherein the regulation circuit comprises a current source which is coupled to the regulated node and configured to generate a current which fixes an amount of current which flows through the input transistor for biasing the current-mode output circuit.

6. A system, comprising:
a radio frequency signal generator which is configured to convert a baseband signal to a radio frequency signal, the radio frequency signal generator comprising:
a baseband filter stage comprising a voltage-mode filter circuit which is configured to filter the baseband signal and generate a voltage signal on an output terminal of the voltage-mode filter circuit;
an output stage configured to generate and output the radio frequency signal, the output stage comprising a plurality of current-mode stages including a baseband input stage, wherein the baseband input stage comprises an input transistor which comprises a gate terminal coupled to the output terminal of the voltage-mode filter circuit, and a source terminal coupled to a regulated node; and
a regulation circuit configured to adjust a voltage level on the regulated node to maintain a constant gate-source bias voltage for the input transistor to generate a current for biasing the current-mode stages of the output stage.

7. The system of claim 6, wherein the voltage-mode filter circuit comprises an analog Sallen-Key filter circuit that is based on a unity gain source follower.

8. The system of claim 6, wherein the regulation circuit comprises:
a low-dropout voltage regulator circuit which is configured to receive as input an unregulated power supply voltage and a reference voltage, and generate a regulated power supply voltage on the regulated node, which corresponds to the reference voltage; and
a replica bias circuit which is configured to generate the reference voltage based on replica devices and topologies of the baseband filter stage and the output stage.

9. The system of claim 6, wherein the regulation circuit comprises a current source which is coupled to the regulated node and configured to generate a current which fixes an amount of current which flows through the input transistor for biasing the current-mode stages of the output stage.

10. The system of claim 6, wherein the current-mode stages of the output stage comprise a mixer stage having input nodes coupled to output nodes of the baseband input stage, and an attenuation stage having input nodes coupled to output nodes of the mixer stage.

11. The system of claim 6, wherein the current-mode stages of the output stage comprise a mixer stage and an attenuation stage, wherein the mixer stage and the attenuation stage have commonly connected input nodes which are connected to output nodes of the baseband input stage, and wherein output nodes of the attenuation stage are coupled to a negative power supply node.

12. The system of claim 11, wherein:
the mixer stage comprises a plurality of mixer segments;
the attenuation stage comprises a plurality of attenuation segments;
the mixer segments and the attenuation segments are selectively enabled or disabled by a control system to obtain a target attenuation factor based on a ratio of a number of enabled mixer segments and a number of enabled attenuation segments; and
each enabled attenuation segment is configured to shunt a portion of a baseband current signal, which is output from the baseband input stage, to the negative power supply node.

13. A system, comprising:
a quantum processor comprising at least one superconducting quantum bit;
an arbitrary waveform generator comprising at least one arbitrary waveform generator channel configured to convert a baseband signal to a radio frequency control pulse which controls the at least one superconducting quantum bit, wherein the at least one arbitrary waveform generator channel comprises:
a baseband filter stage comprising a voltage-mode filter circuit which is configured to filter the baseband signal and generate a voltage signal on an output terminal of the voltage-mode filter circuit;
an output stage configured to generate and output the radio frequency control pulse, the output stage comprising a plurality of current-mode stages including a baseband input stage, wherein the baseband input stage comprises an input transistor which comprises a gate terminal coupled to the output terminal of the voltage-mode filter circuit, and a source terminal coupled to a regulated node; and
a regulation circuit configured to adjust a voltage level on the regulated node to maintain a constant gate-source bias voltage for the input transistor to generate a current for biasing the current-mode stages of the output stage.

14. The system of claim 13, wherein the voltage-mode filter circuit comprises an analog Sallen-Key filter circuit that is based on a unity gain source follower.

15. The system of claim 13, wherein the regulation circuit comprises:
a low-dropout voltage regulator circuit which is configured to receive as input an unregulated power supply voltage and a reference voltage, and generate a regulated power supply voltage on the regulated node, which corresponds to the reference voltage; and
a replica bias circuit which is configured to generate the reference voltage based on replica devices and topologies of the baseband filter stage and the output stage.

16. The system of claim 13, wherein the regulation circuit comprises a current source which is coupled to the regulated node and configured to generate a current which fixes an amount of current which flows through the input transistor for biasing the current-mode stages of the output stage.

17. The system of claim 13, wherein the current-mode stages of the output stage comprise a mixer stage having input nodes coupled to output nodes of the baseband input stage, and an attenuation stage having input nodes coupled to output nodes of the mixer stage.

18. The system of claim 13, wherein the current-mode stages of the output stage comprise a mixer stage and an attenuation stage, wherein the mixer stage and the attenuation stage have commonly connected input nodes which are connected to output nodes of the baseband input stage, and wherein output nodes of the attenuation stage are coupled to a negative power supply node.

19. The system of claim 18, wherein:
the mixer stage comprises a plurality of mixer segments;
the attenuation stage comprises a plurality of attenuation segments;

the mixer segments and the attenuation segments are selectively enabled or disabled by a control system to obtain a target attenuation factor based on a ratio of a number of enabled mixer segments and a number of enabled attenuation segments; and each enabled attenuation segment is configured to shunt a portion of a baseband current signal, which is output from the baseband input stage, to the negative power supply node.

20. A system, comprising:

a radio frequency signal generator which is configured to convert a baseband signal to a radio frequency signal, the radio frequency signal generator comprising:

a baseband filter stage comprising a voltage-mode filter circuit which is configured to filter the baseband signal and generate a voltage signal on an output terminal of the voltage-mode filter circuit;

a mixer stage comprising a voltage-mode mixer circuit which is configured to convert the filtered baseband signal to the radio frequency signal;

an output stage comprising a plurality of current-mode stages including a radio frequency signal input stage, wherein the radio frequency signal input stage comprises an input transistor which comprises a gate terminal coupled to the output terminal of the voltage-mode mixer circuit, and a source terminal coupled to a regulated node; and a regulation circuit configured to adjust a voltage level on the regulated node to maintain a constant gate-source bias voltage for the input transistor to generate a current for biasing the current-mode stages of the output stage.

21. The system of claim 20, wherein the voltage-mode filter circuit comprises an analog Sallen-Key filter circuit that is based on a unity gain source follower.

22. The system of claim 20, wherein the regulation circuit comprises:

a low-dropout voltage regulator circuit which is configured to receive as input an unregulated power supply voltage and a reference voltage, and generate a regulated power supply voltage on the regulated node, which corresponds to the reference voltage; and a replica bias circuit which is configured to generate the reference voltage based on replica devices and topologies of the baseband filter stage and the output stage.

23. The system of claim 20, wherein the regulation circuit comprises a current source which is coupled to the regulated node and configured to generate a current which fixes an amount of current which flows through the input transistor for biasing the current-mode stages of the output stage.

24. A method, comprising:

generating a voltage signal on an output terminal of a voltage-mode filter circuit;

applying the voltage signal to a gate terminal of an input transistor of a current-mode output circuit, wherein the input transistor comprises a source terminal coupled to a regulated node; and adjusting a voltage level on the regulated node to maintain a constant gate-source bias voltage for the input transistor to generate a current for biasing the current-mode output circuit.

25. The method of claim 24, wherein adjusting a voltage level on the regulated node comprises one of:

generating, by a low-dropout voltage regulator circuit, a regulated supply voltage on the regulated node, which corresponds to a reference voltage that is generated by a replica bias circuit based on replica devices and topologies of the voltage-mode filter circuit and the current-mode output circuit; and generating, by a current source, a current which is applied to the regulated node to fix an amount of current which flows through the input transistor for biasing the current-mode output circuit.

* * * * *